United States Patent
Chen et al.

(10) Patent No.: US 11,557,609 B2
(45) Date of Patent: Jan. 17, 2023

(54) INTEGRATED CIRCUIT STRUCTURE AND METHOD OF FORMING THE SAME

(71) Applicant: TAIWAN SEMICONDUCTOR MANUFACTURING COMPANY, LTD., Hsinchu (TW)

(72) Inventors: Tzu-Yu Chen, Kaohsiung (TW); Sheng-Hung Shih, Hsinchu (TW); Fu-Chen Chang, New Taipei (TW); Kuo-Chi Tu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 68 days.

(21) Appl. No.: 17/192,796

(22) Filed: Mar. 4, 2021

(65) Prior Publication Data

US 2022/0285373 A1  Sep. 8, 2022

(51) Int. Cl.
| | | |
|---|---|---|
| H01L 27/11 | (2006.01) | |
| H01L 29/78 | (2006.01) | |
| H01L 27/1159 | (2017.01) | |
| H01L 29/51 | (2006.01) | |
| H01L 29/66 | (2006.01) | |
| H01L 21/28 | (2006.01) | |

(52) U.S. Cl.
CPC .... *H01L 27/1159* (2013.01); *H01L 29/40111* (2019.08); *H01L 29/516* (2013.01); *H01L 29/6684* (2013.01); *H01L 29/78391* (2014.09)

(58) Field of Classification Search
CPC .......... H01L 27/1159; H01L 29/40111; H01L 29/516; H01L 29/6684; H01L 29/78391
USPC ......................................................... 257/295
See application file for complete search history.

(56) References Cited

U.S. PATENT DOCUMENTS

| | | | | |
|---|---|---|---|---|
| 9,853,150 | B1 * | 12/2017 | Colinge ............. | H01L 27/1159 |
| 2015/0340372 | A1 * | 11/2015 | Pandey .............. | H01L 29/6684 |
| | | | | 257/295 |
| 2017/0162587 | A1 * | 6/2017 | Chavan .............. | H01L 29/4966 |
| 2017/0365719 | A1 * | 12/2017 | Chen ................. | H01L 27/11521 |
| 2018/0166453 | A1 * | 6/2018 | Müller ..................... | H01L 28/60 |
| 2018/0337055 | A1 * | 11/2018 | Yamaguchi ....... | H01L 21/02345 |
| 2018/0350800 | A1 * | 12/2018 | Chang .................. | H01L 29/516 |
| 2019/0198617 | A1 * | 6/2019 | Li ...................... | H01L 29/78642 |
| 2020/0075609 | A1 * | 3/2020 | Morris ................ | H01L 27/1159 |
| 2020/0144293 | A1 * | 5/2020 | Maj ....................... | H01L 29/516 |
| 2020/0212224 | A1 * | 7/2020 | Penumatcha ....... | G11C 11/2275 |
| 2021/0151445 | A1 * | 5/2021 | Wagner ................ | H01L 29/516 |
| 2021/0399135 | A1 * | 12/2021 | Polakowski ...... | H01L 29/40111 |

\* cited by examiner

*Primary Examiner* — Sheikh Maruf
(74) *Attorney, Agent, or Firm* — Maschoff Brennan

(57) ABSTRACT

A structure includes a semiconductor substrate, a gate structure, a source/drain feature, a source/drain contact, a dielectric layer, and a ferroelectric random access memory (FE-RAM) structure. The gate structure is on the semiconductor substrate. The source/drain feature is adjacent to the gate structure. The source/drain contact lands on the source/drain feature. The dielectric layer spans the source/drain contact. The FeRAM structure is partially embedded in the dielectric layer and includes a bottom electrode layer on the source/drain contact and having an U-shaped cross section, a ferroelectric layer conformally formed on the bottom electrode layer, and a top electrode layer over the ferroelectric layer.

20 Claims, 32 Drawing Sheets

INTEGRATED CIRCUIT STRUCTURE AND METHOD OF FORMING THE SAME

BACKGROUND

The semiconductor integrated circuit (IC) industry has experienced rapid growth. Technological advances in IC materials and design have produced generations of ICs. Each generation has smaller and more complex circuits than the previous generation.

In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs.

However, these advances have increased the complexity of processing and manufacturing ICs. Since feature sizes continue to decrease, fabrication processes continue to become more difficult to perform. Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
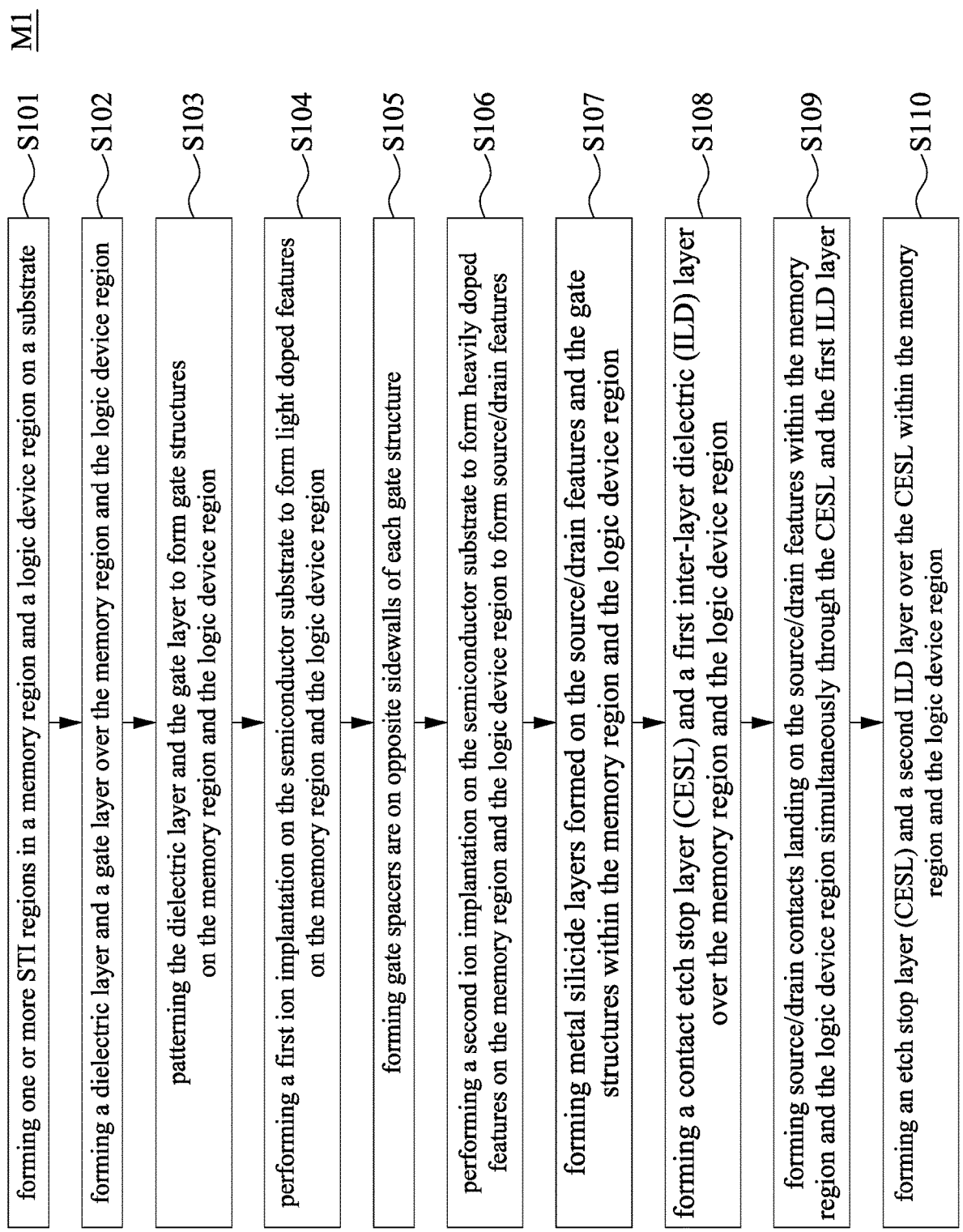
FIGS. 1A and 1B are flow charts of a method for forming an IC structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

FERAM cell is a semiconductor memory that is used for the ferroelectric film (Film Ferroelectric) in a part of the memory cell, the memory cell of the ferroelectric film by the polarization state data ("0", "1") is determined. That FeRAM comprises cell a high-speed operation and reduction in power consumption, increase in the memory capacity, increased, etc. are possible and with the nonvolatile be cut off the power data is not erased in to allow the rewriting number of times (write/erase cycles) it has a lot of features.

Figure 1B:
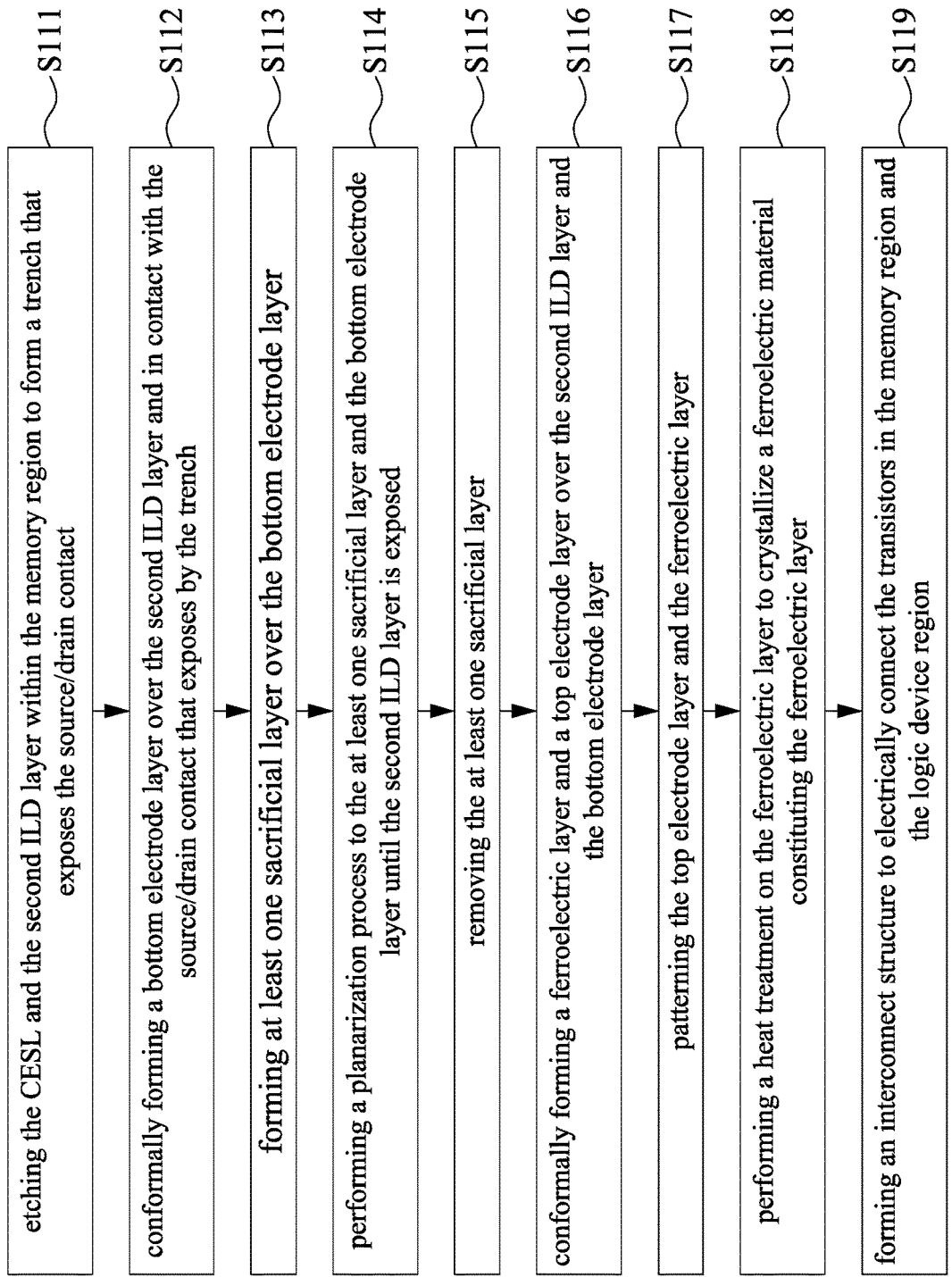

Referring now to FIGS. 1A and 1B, illustrated are an exemplary method M1 for fabrication of an integrated circuit (IC) structure in accordance with some embodiments. The method M1 includes a relevant part of the entire manufacturing process. It is understood that additional operations may be provided before, during, and after the operations shown by FIGS. 1A and 1B, and some of the operations described below can be replaced or eliminated for additional embodiments of the method. The order of the operations/processes may be interchangeable. The method M1 includes fabrication of an IC structure 100 including a ferroelectric random access memory (FERAM) cell. However, the fabrication of the IC structure is merely example for describing the improved IC structure process according to some embodiments of the present disclosure.

Figure 2:
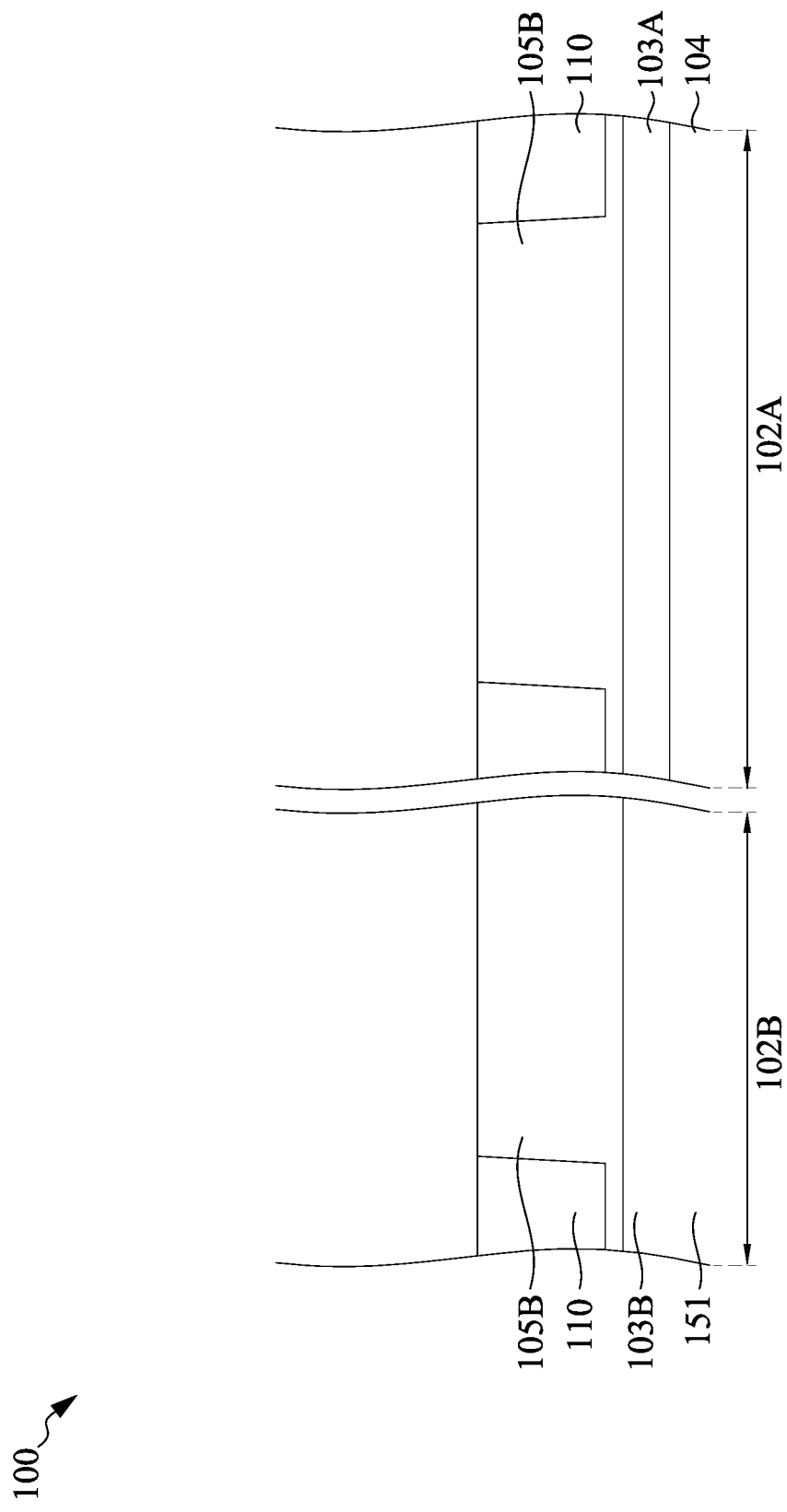
FIGS. 2 to 20 illustrate a method in various stages of forming an IC structure in accordance with some embodiments of the present disclosure.

FIGS. 2 to 20 illustrate an IC structure 100 at various stages of the method M1 according to some embodiments of the present disclosure. The method M1 begins at block S101 where one or more STI regions are formed in a memory region and a logic region on a substrate. With reference to FIG. 2, an integrated circuit 100 includes a memory region 102A and a logic region 102B on a semiconductor substrate 151. The logic region 102B may include circuitry, such as an exemplary logic transistor. The memory region 102A can correspond to an array of memory cells (which may be also referred to as ferroelectric random access memory (FE-RAM) structures) while the logic region 102B can couple logic devices, such as transistors formed in a substrate underlying thereof, to support operation of the memory cells. Specifically, the circuitry of the logic region 102B is for processing information received from memory cells in the memory region 102A and for controlling reading and writing functions of the memory cells. Well regions 103A and 103B are formed in the semiconductor substrate 151 of the memory region 102A and the logic region 102B. Subsequently, a deep well region 104 is formed in the well region 103A of the semiconductor substrate 151 in the memory region 102A, as illustrated in FIG. 2.

This is described in greater detail with reference to FIG. 2, the semiconductor substrate 151 may include a semiconductor wafer such as a silicon wafer. Alternatively, the semiconductor substrate 151 may include other elementary semiconductors such as germanium. The semiconductor substrate 151 may also include a compound semiconductor such as silicon carbide, gallium arsenic, indium arsenide, and indium phosphide. Moreover, the semiconductor substrate 151 may include an alloy semiconductor such as silicon germanium, silicon germanium carbide, gallium arsenic phosphide, and gallium indium phosphide. In some embodiments, the semiconductor substrate 151 includes an epitaxial layer (epi layer) overlying a bulk semiconductor. Furthermore, the semiconductor substrate 151 may include a semiconductor-on-insulator (SOI) structure. For example, the semiconductor substrate 151 may include a buried oxide (BOX) layer formed by a process such as separation by implanted oxygen (SIMOX). In various embodiments, the semiconductor substrate 151 may include a buried layer such as an n-type buried layer (NBL), a p-type buried layer (PBL), and/or a buried dielectric layer including a buried oxide (BOX) layer. By way of example but not limiting the present disclosure, a deep n-well is formed in a p-type semiconductor substrate in the memory region 102A. Alternatively, a deep p-well is formed in an n-type semiconductor substrate in the memory region 102A.

In some embodiments, illustrated as an n-type MOS in the logic region 102B, the semiconductor substrate 151 includes a p-type silicon substrate (p-substrate). For example, p-type impurities (e.g., boron) are doped into the semiconductor substrate 151 to form the p-type well region in the memory region 102A and the logic region 102B simultaneously. The deep n-well (DNW) may be implanted deeply under the active region 105A of the semiconductor substrate 151 in the memory region 102A. In some embodiments, The DNW is formed by an ion implantation process. A patterned photoresist layer (not illustrated) may be formed over the logic region 102B as a mask during the implantation process. By way of example but not limiting the present disclosure, the DNW may be formed by an implantation process having a dose that may be in a range from about $1.0 \times 10^{11}$ atoms/centimeter$^3$ to about $1.0 \times 10^{13}$ atoms/centimeter$^3$, and other dose ranges are within the scope of the disclosure. In some embodiments, the DNW has a dopant concentration that may be greater than $1.0 \times 10^{13}$ atoms/centimeter$^3$, and other dopant concentrations are within the scope of the disclosure. The DNW functions to electrically isolate the semiconductor substrate 151.

Alternatively, in some embodiments, illustrated as a p-type MOS in the logic region 102A, the semiconductor substrate 151 includes an n-type silicon substrate (n-substrate). For example, n-type impurities (e.g., arsenic or phosphorus) are doped into the semiconductor substrate 151 to form the n-type well region in the memory region 102A and the logic region 102B simultaneously. The deep p-well (DPW) may be implanted deeply under the active region of the semiconductor substrate 151 in the memory region 102A. In some embodiments, The DPW is formed by an ion implantation process. A patterned photoresist layer (not illustrated) may be formed over the logic region 102B as a mask during the implantation process. By way of example and not limitation, the DPW may be formed by an implantation process having a dose that may be in a range from about $1.0 \times 10^{11}$ atoms/centimeter$^3$ to about $1.0 \times 10^{13}$ atoms/centimeter$^3$, and other dose ranges are within the scope of the disclosure. In some embodiments, the DPW has a dopant concentration that may be greater than $1.0 \times 10^{13}$ atoms/centimeter$^3$, and other dopant concentrations are within the scope of the disclosure. The DPW functions to electrically isolate the semiconductor substrate 151. In some embodiments, the well regions in the memory region 102A and the logic region 102B may have opposite conductivity types. By way of example but not limiting the present disclosure, the memory region 102A may have a p-type well region and the logic region 102B may have an n-type well region.

In FIG. 2, one or more isolation regions, such as a shallow trench isolation (STI) region 110 are formed in the memory region 102A and the logic region 102B on the semiconductor substrate 151. Formation of the STI region 110 includes patterning the semiconductor substrate 151 to form one or more trenches in the semiconductor substrate 151 by using suitable photolithography and etching techniques, depositing one or more dielectric materials (e.g., silicon oxide) to completely fill the trenches in the semiconductor substrate 151, followed by a planarization process (e.g., chemical mechanical polish (CMP) process) to level the STI region 110 with the active regions 105A and 105B of the memory region 102A and the logic region 102B. The dielectric materials of the STI region 110 may be deposited using a high density plasma chemical vapor deposition (HDP-CVD), a low-pressure CVD (LPCVD), sub-atmospheric CVD (SACVD), a flowable CVD (FCVD), spin-on coating, and/or the like, or a combination thereof. After the deposition, an anneal process or a curing process may be performed, especially when the STI region 110 is formed using flowable CVD. Although the cross-sections of the STI region 110 illustrated in FIG. 2 has tapered sidewalls, they may have vertical sidewalls in some embodiments.

In the depicted embodiment, the STI region 110 has a top surface substantially level with a top surface of the active regions 105A and 105B of the memory region 102A and the logic region 102B. In some embodiments, the STI region 110 is further recessed (e.g., by an etch back process) to fall below the top surfaces of the active regions 105A and 105B, such that the active regions 105A and 105B protrudes above the top surface of the recessed STI region 110 (as indicated by the dash lines S11 in FIG. 2 to form fin-like structures, which in turn allows for forming fin-type field effect transistors (FinFETs) over the active regions 105A and 105B.

Figure 3:
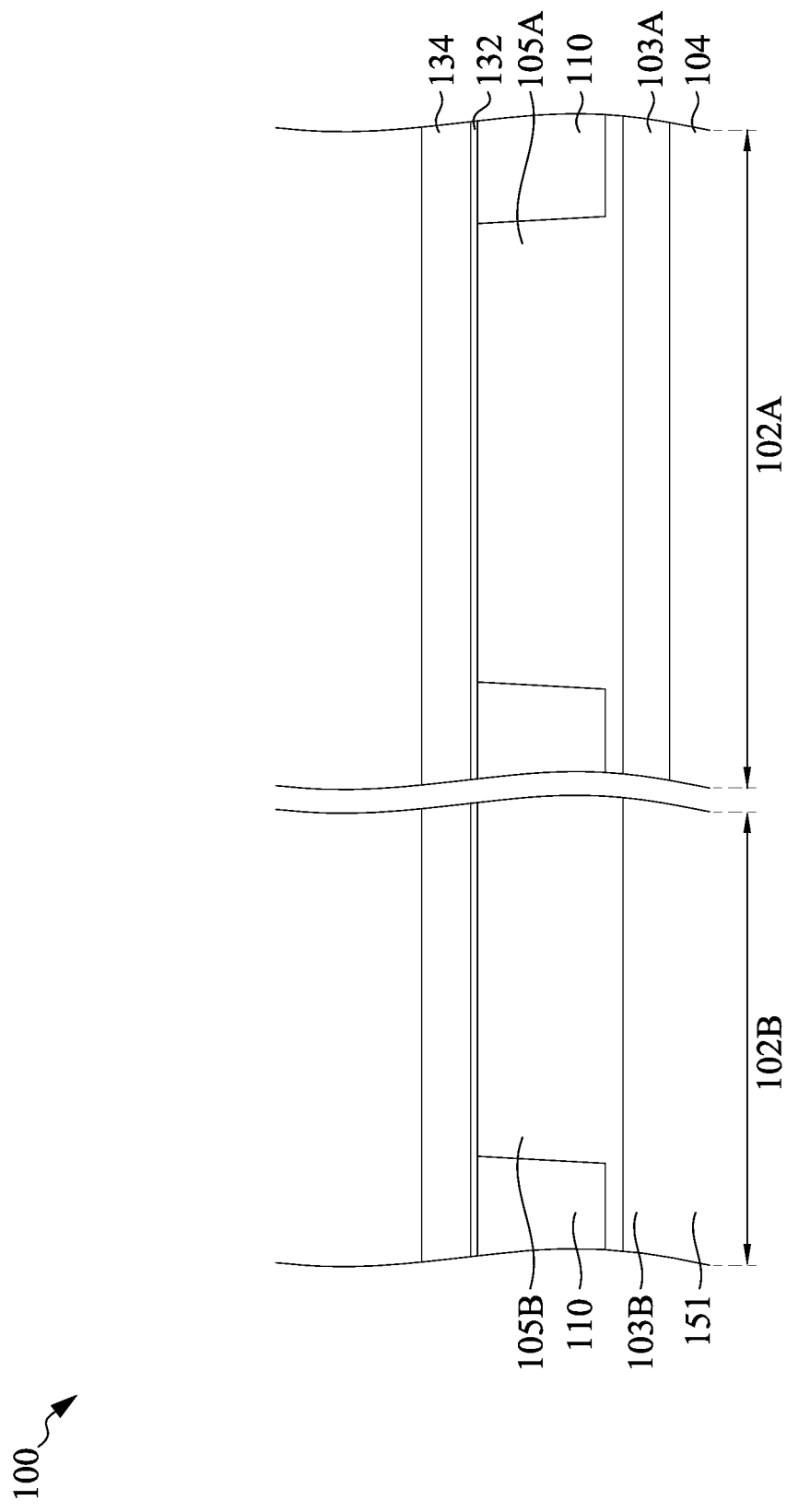

Returning to FIG. 1A, the method M1 then proceeds to block S102 where a dielectric layer and a gate layer are formed over the memory region and the logic region. With reference to FIG. 3, in some embodiments of block S102, once formation of the STI region 110 is complete, a dielectric layer 132 is formed over the memory region 102A and the logic region 102B and a gate layer 134 is formed over the dielectric layer 132. In some embodiments, the dielectric layer 132 may include a stack of an interfacial dielectric material and a high-k dielectric material.

By way of example and not limitation, the dielectric layer 132 may be made of silicon oxide, silicon nitride, or the like, or the combinations thereof. In some embodiments, the dielectric layer 132 may be made of high-k gate dielectric materials include, but are not limited to, hafnium oxide (HfO$_2$), hafnium silicon oxide (HfSiO), hafnium silicon oxynitride (HfSiON), hafnium tantalum oxide (HfTaO), hafnium titanium oxide (HMO), hafnium zirconium oxide (HfZrO), metal oxides, metal nitrides, metal silicates, transition metal-oxides, transition metal-nitrides, transition metal-silicates, oxynitrides of metals, metal aluminates, zirconium silicate, zirconium aluminate, zirconium oxide, titanium oxide, aluminum oxide, hafnium dioxide-alumina (HfO$_2$—Al$_2$O$_3$) alloy, other suitable high-k dielectric materials, and/or combinations thereof. In some embodiments, the gate layer 134 includes a semiconductor material such as polysilicon, amorphous silicon, or the like. The gate layer 134 may be deposited doped or undoped. For example, in some embodiments the gate layer 134 includes polysilicon deposited undoped by low-pressure chemical vapor deposition (LPCVD). The polysilicon may also be deposited, for example, by furnace deposition of an in-situ doped polysilicon. Alternatively, the gate layer 134 may include other suitable materials.

Figure 4:
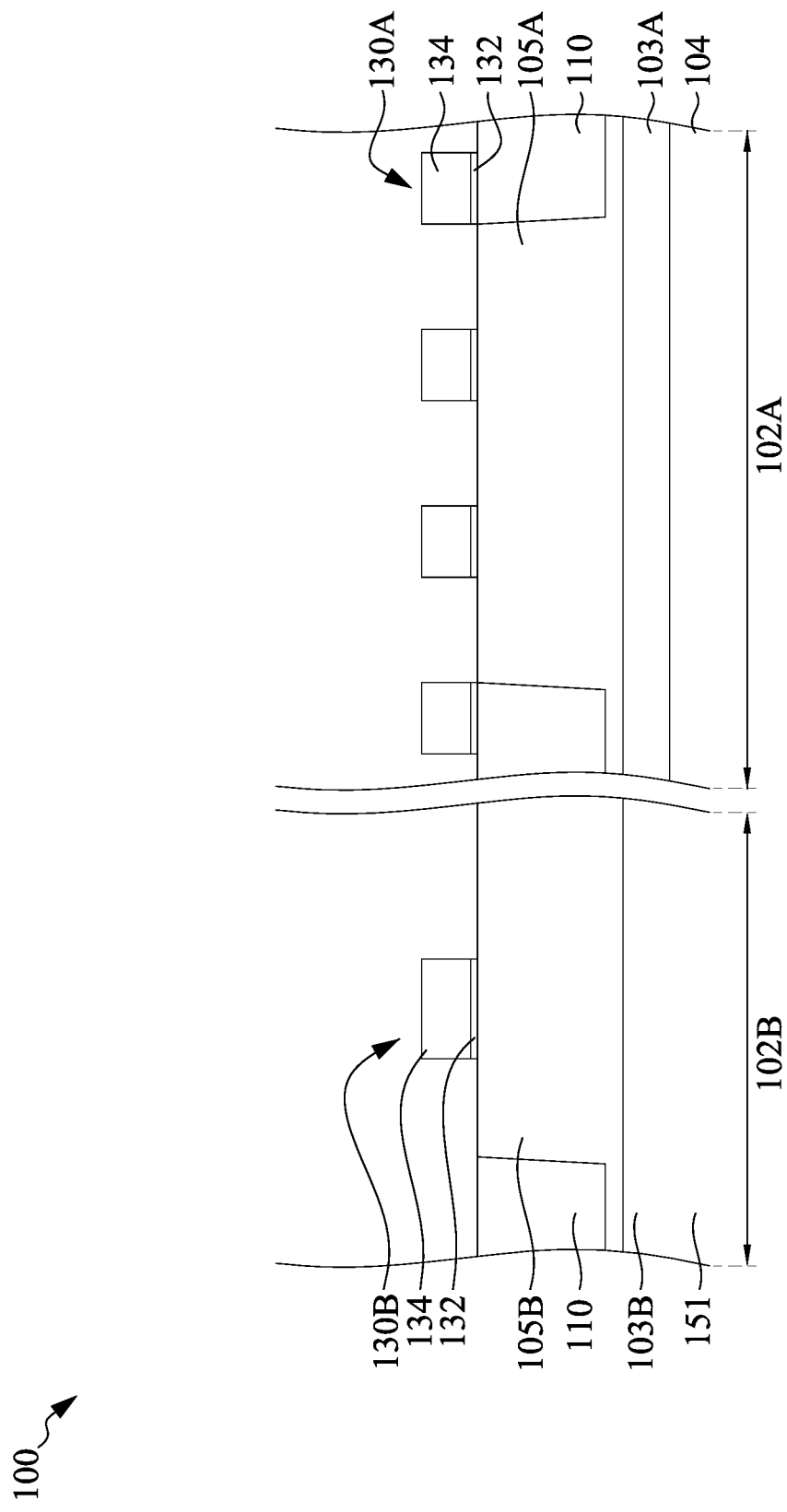

Returning to FIG. 1A, the method M1 then proceeds to block S103 where the dielectric layer and the gate layer are patterned to form gate structures on the memory region and the logic region. With reference to FIG. 4, in some embodiments of block S103, the dielectric layer 132 and the gate layer 134 are patterned by using suitable photolithography and etching techniques, resulting in a gate structure 130A on the memory region 102A and a gate structure 130B on the logic region 102B. The gate structures 130A and 130B each including gate dielectric material and sacrificial gate material to serve as its dielectric layer 132 and gate layer 134. In greater detail, at the time the dielectric layer 132 and the gate layer 134 of the gate structure 130B on the logic region 102B is formed, a gate stack, which also includes gate dielectric 132 and sacrificial gate 134, is formed simultaneously on the memory region 102A.

Figure 5:
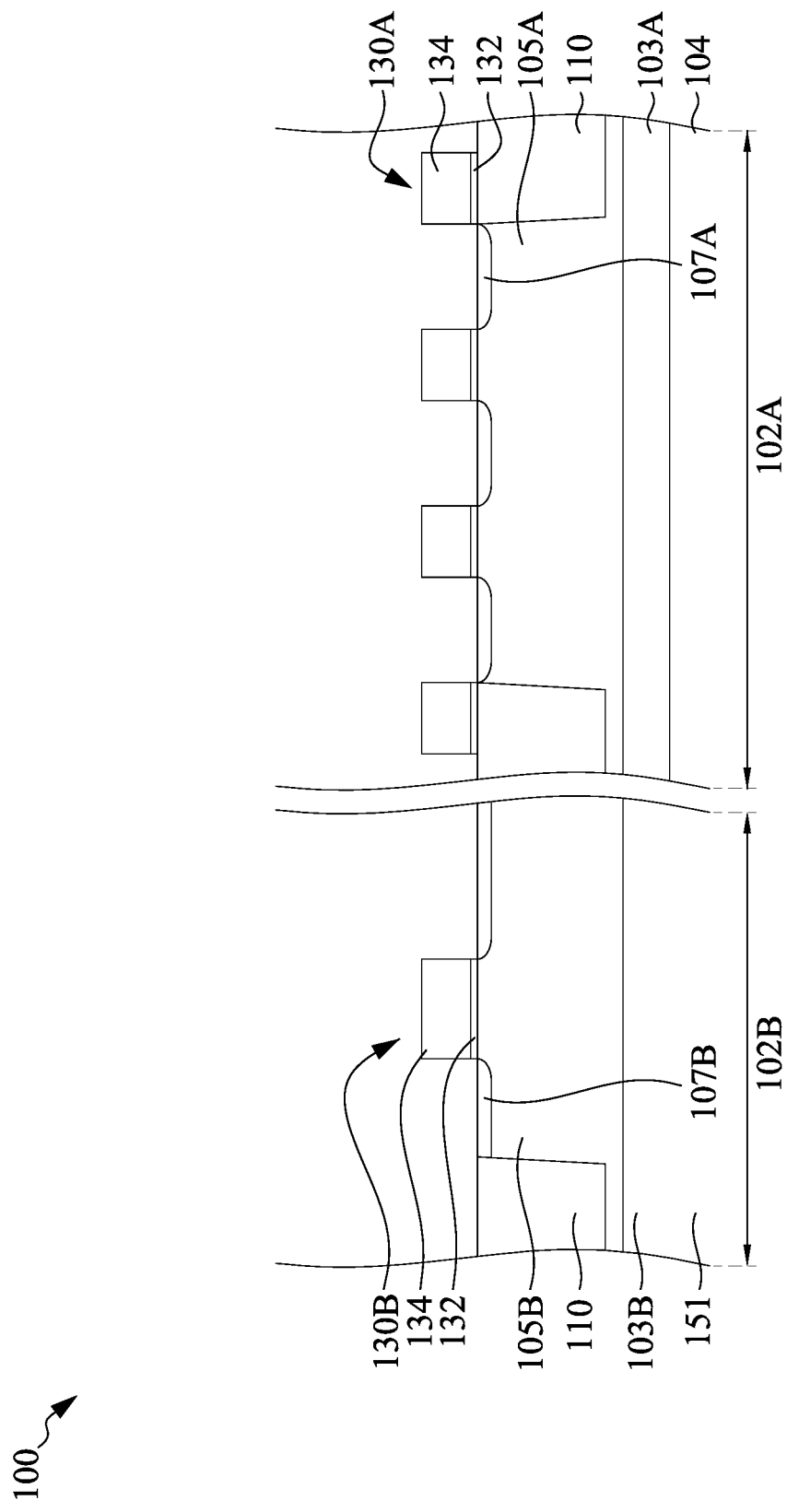

Returning to FIG. 1A, the method M1 then proceeds to block S104 where a first ion implantation is performed on the semiconductor substrate to form light doped features on the memory region and the logic region. With reference to FIG. 5, in some embodiments of block S104, a first ion implantation is performed to introduce doping species into the semiconductor substrate 151 on the memory region 102A and the logic region 102B. Since the second ion implantation is implemented after the formation of the gate structures 130A on the memory region 102A and the gate structure 130B on the logic region 102B, the corresponding doped features 107A and 107B are substantially formed on sides of the gate structures 130A and 130B but not in the channel regions underlying the gate structures 130A and 130B. In some embodiments, the doped features 107A and 107B are in the channel regions underlying the gate structures 130A and 130B. The first ion implantation may include various implantation steps to form respective light doped features 107A and 107B. In some embodiments, the first ion implantation includes light doped drain (LDD) ion implantation. In some embodiments, an n-type dopant, such as phosphorous or arsenic, is introduced to the semiconductor substrate 151 on the memory region 102A and the logic region 102B to form n-type LDD features 107A and 107B. The doping dose may be greater than about 1×10$^{14}$/cm$^2$ to effectively change the refractive index of the semiconductor substrate 151. In some embodiments, the LDD implantation includes a dose about 10$^{15}$ ions/cm$^2$. In some embodiments, the LDD implantation includes an implant energy ranging between about 50 keV and about 100 keV. In some embodiments, a p-type doping species, such as boron (B), may be alternatively used to form p-type LDD features in the semiconductor substrate 151 on the memory region 102A and the logic region 102B. In greater detail, at the time the light doped features 107B on the logic region 102B is formed, the light doped features 107A is formed simultaneously on the memory region 102A.

Figure 6:
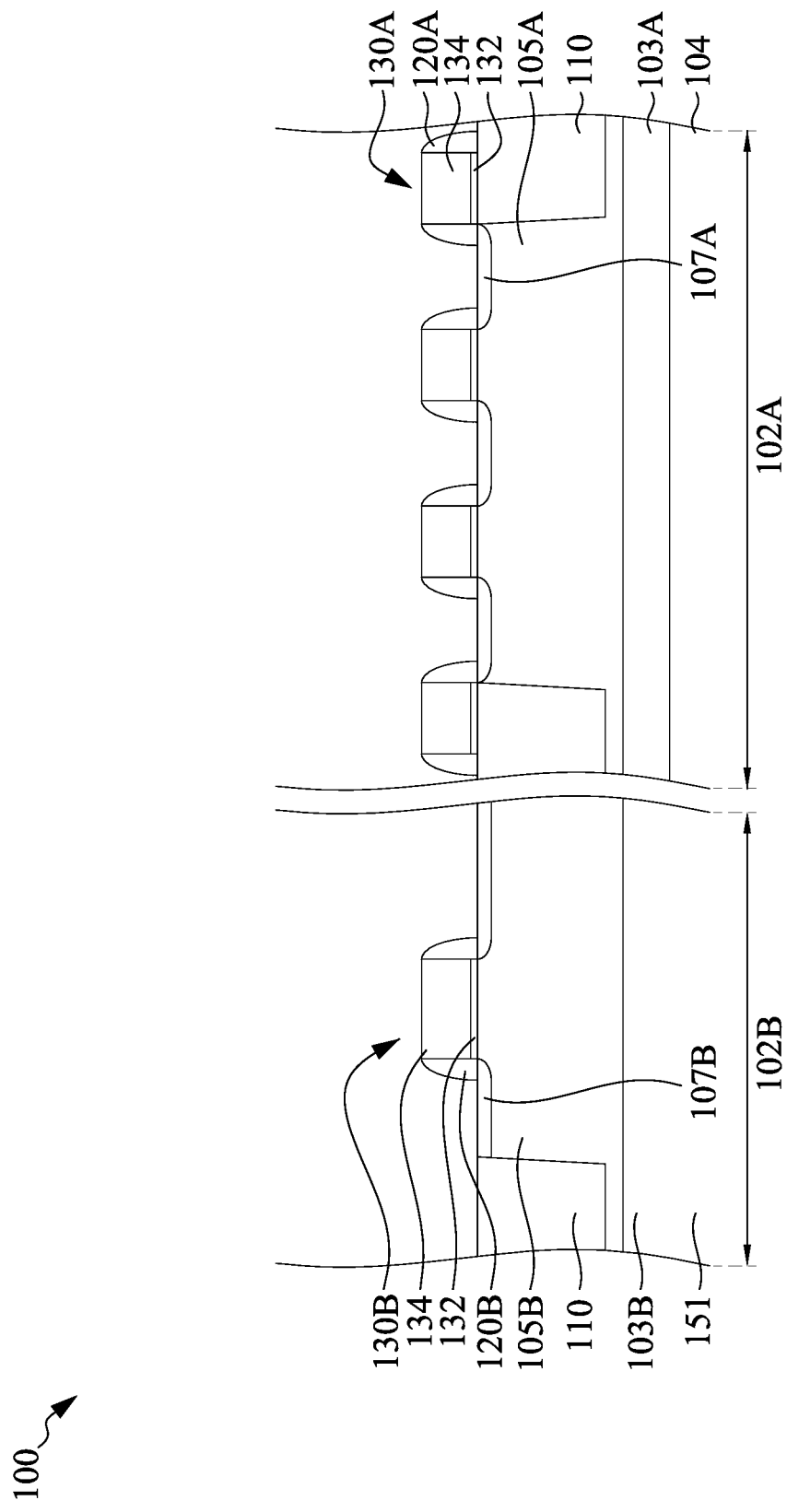

Returning to FIG. 1A, the method M1 then proceeds to block S105 where gate spacers are then formed on opposite sidewalls of each gate structure. With reference to FIG. 6, in some embodiments of block S105, spacers 120A and 120B are then formed on opposite sidewalls of each gate structures 130A and 130B. The spacers 120A and 120B may be formed by, for example, deposition and anisotropic etch of a spacer dielectric layer performed after the gate patterning is complete. In some embodiments, the spacer dielectric layer may include one or more dielectrics, such as silicon oxide, silicon nitride, silicon oxynitride, silicon carbide, silicon carbonitride, the like, or a combination thereof. In some embodiments, the spacers 120A and 120B may also include composite layers including, for example, a silicon nitride layer on a silicon oxide layer. The anisotropic etch process removes the spacer dielectric layer from over the top of the gate structures 130A and 130B while leaving the spacers 120A and 120B along the sidewalls of the gate structures 130A and 130B. In greater detail, at the time the spacer 120B of the gate structure 130B on the logic region 102B is formed, the gate spacer 120A is simultaneously formed to laterally surround the gate structure 130A on the memory region 102A.

In some embodiments, a replacement gate (RPG) process scheme is employed. In a RPG process scheme, a dummy gate (such as the gate structures 130A and 130B in this case) is formed first and is replaced later by a metal gate after high thermal budget processes are performed. The gate structures 130A and 130B may be removed to form openings with the spacers 120A and 120B as their sidewalls. In some embodiments, portions of the dielectric layer 132 exposed by the openings are removed as well. Alternatively, in some embodiments, the gate structures 130A and 130B are removed while the dielectric layer 132 retains. The gate structures 130A and 130B (and the dielectric layer 132) may be removed by dry etch, wet etch, or a combination of dry and wet etch. For example, a wet etch process may include exposure to a hydroxide containing solution (e.g., ammonium hydroxide), deionized water, and/or other suitable etchant solutions.

Thereafter, additional processes may be performed to manufacture the semiconductor device. For example, the metal gate may be doped, portions of the metal gate may be silicided, inter-layer dielectric (ILD) layers/and inter-metal dielectric (IMD) layers may be formed, metallization layers may be formed, and the like.

Figure 7:
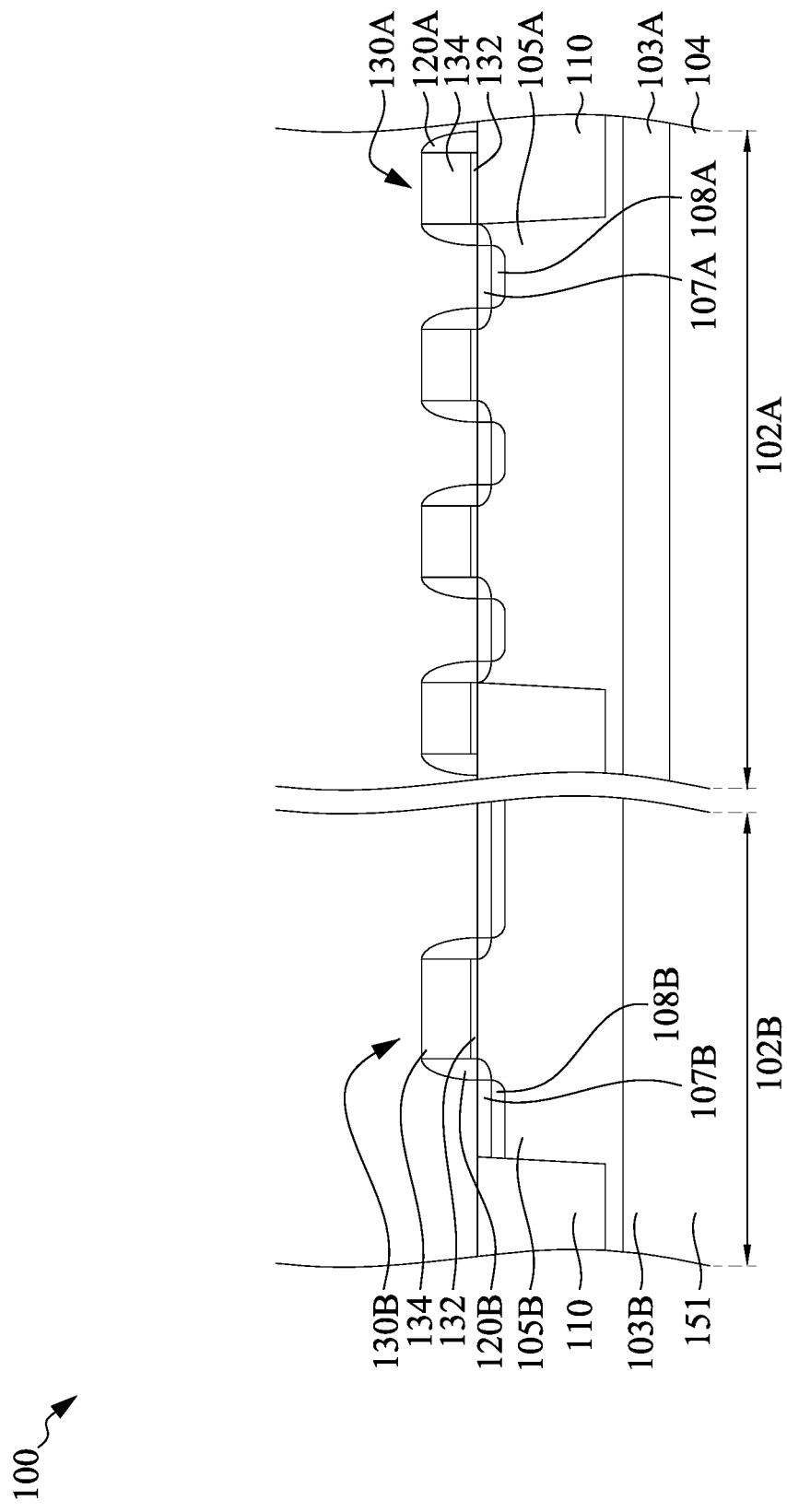

Returning to FIG. 1A, the method M1 then proceeds to block S106 where a second ion implantation is performed on the semiconductor substrate to form heavily doped features on the memory region and the logic region to form source/drain features. With reference to FIG. 7, in some embodiments of block S106, a second ion implantation is performed on the semiconductor substrate 151 to form heavily doped features on the memory region 102A and the logic region 102B after the first ion implantation to form source/drain features 108A and 108B. Therefore, the gate structures 130A on the memory region 102A and the gate structure 130B on the logic region 102B each include both LDD features and source/drain features, collectively referred to as source and drain regions. When the device region 102B includes both n-type FETs (nFETs) and p-type FETs (pFETs), the source and drain regions are formed, respectively, for the n-type FETs and the p-type FETs, using proper doping species. In some embodiments, a high temperature annealing process may be followed to activate the various doping species in the source/drain features on the memory region 102A and the logic region 102B. In greater detail, at the time the source/drain feature 108B on the logic region 102B is formed, the source/drain feature 108A is formed simultaneously on the memory region 102A.

Figure 8:
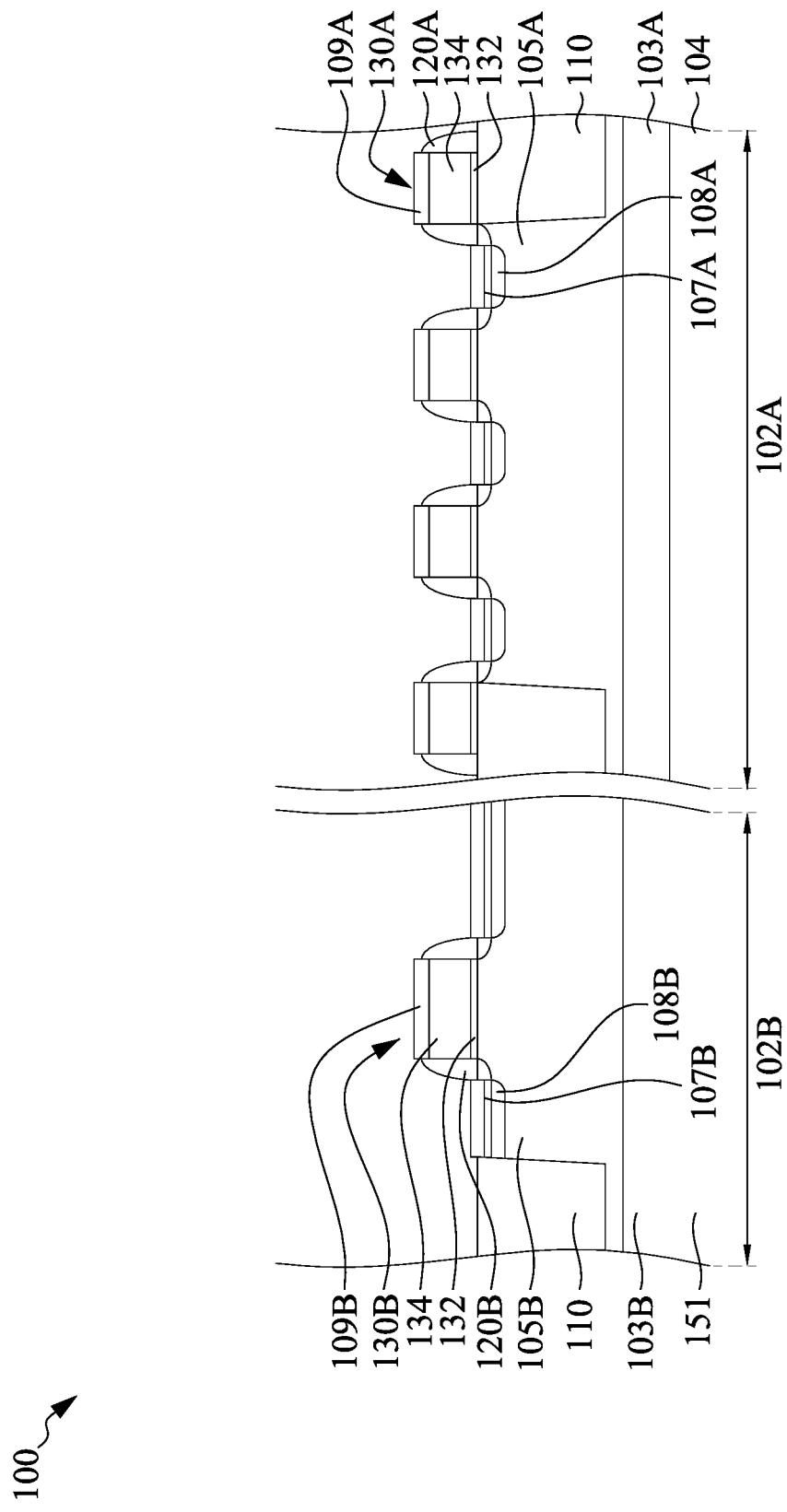

Returning to FIG. 1A, the method M1 then proceeds to block S107 where metal silicide layers are formed on the source/drain features and the gate structures within the memory region and the logic region. With reference to FIG. 8, in some embodiments of block S107, metal silicide layers 109A and 109B are formed on the source/drain features 108A and 108B and the gate structures 130A and 130B within the memory region 102A and the logic region 102B. By way of example but not limiting the present disclosure, the metal silicide layers 109A and 109B made be a Nickel silicide layer. The NiSi formation process may be performed to form the nickel silicide layer. In greater detail, a Ni+TiN deposition process is performed on the memory region 102A and the logic region 102B. Subsequently, the NiSi formation process can be performed in an annealing process, such as rapid thermal anneal (RTA) process, forming the low resistivity NiSi phase followed by a selective etch to remove the unreacted nickel.

In some embodiments, the annealing process is performed at a temperature in a range from about 300 to about 600° C. In some embodiments, the NiSi formation process has a low consumption rate of silicon, and the Nickel silicide layer has low resistivity, such as in a range from about 15 to about 20 μOhm/cm. The silicon agglomeration in the NiSi2 film takes place at higher temperatures, causing the higher resistivity, which may cause a serious degradation in the performance of the devices. In some embodiments, if the temperature of the annealing process is higher than about 600° C., another phase of nickel silicide is formed, nickel disilicide. Nickel disilicide has a higher resistivity than NiSi, such as in a range from about 30 to about 60 μOhm/cm. If the temperature of the annealing process is lower than about 300° C., the amount of nickel silicide layer may be lower than expected.

Figure 9:
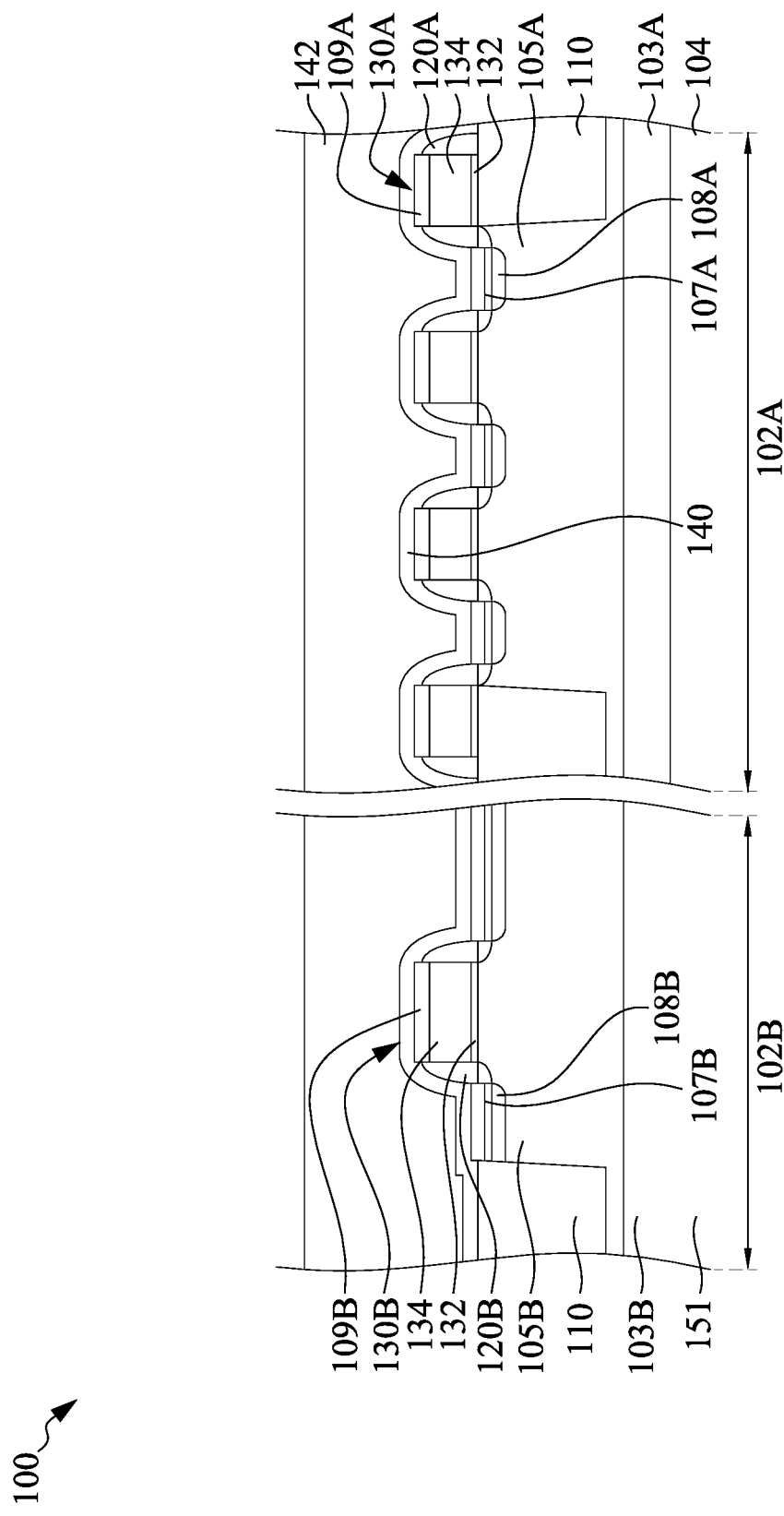

Returning to FIG. 1A, the method M1 then proceeds to block S108 where a contact etch stop layer (CESL) and a first inter-layer dielectric (ILD) layer are formed over the memory region and the logic region. With reference to FIG. 9, in some embodiments of block S108, a contact etch stop layer (CESL) 140 is blanket formed over the gate structures 130A and 130B and an first inter-layer dielectric (ILD) layer 142 is formed over the CESL 140. In some embodiments, the CESL 140 may be formed of silicon nitride, silicon carbide, silicon oxide, and the like. In some embodiments, the first ILD layer 142 may be made of silicon oxide, silicon nitride, silicon oxynitride, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the first ILD layer 142 may be deposited using any suitable method, such as CVD, physical vapor deposition (PVD), ALD, PEALD, PECVD, SACVD, FCVD, spin-on, and/or the like, or a combination thereof.

Figure 10:
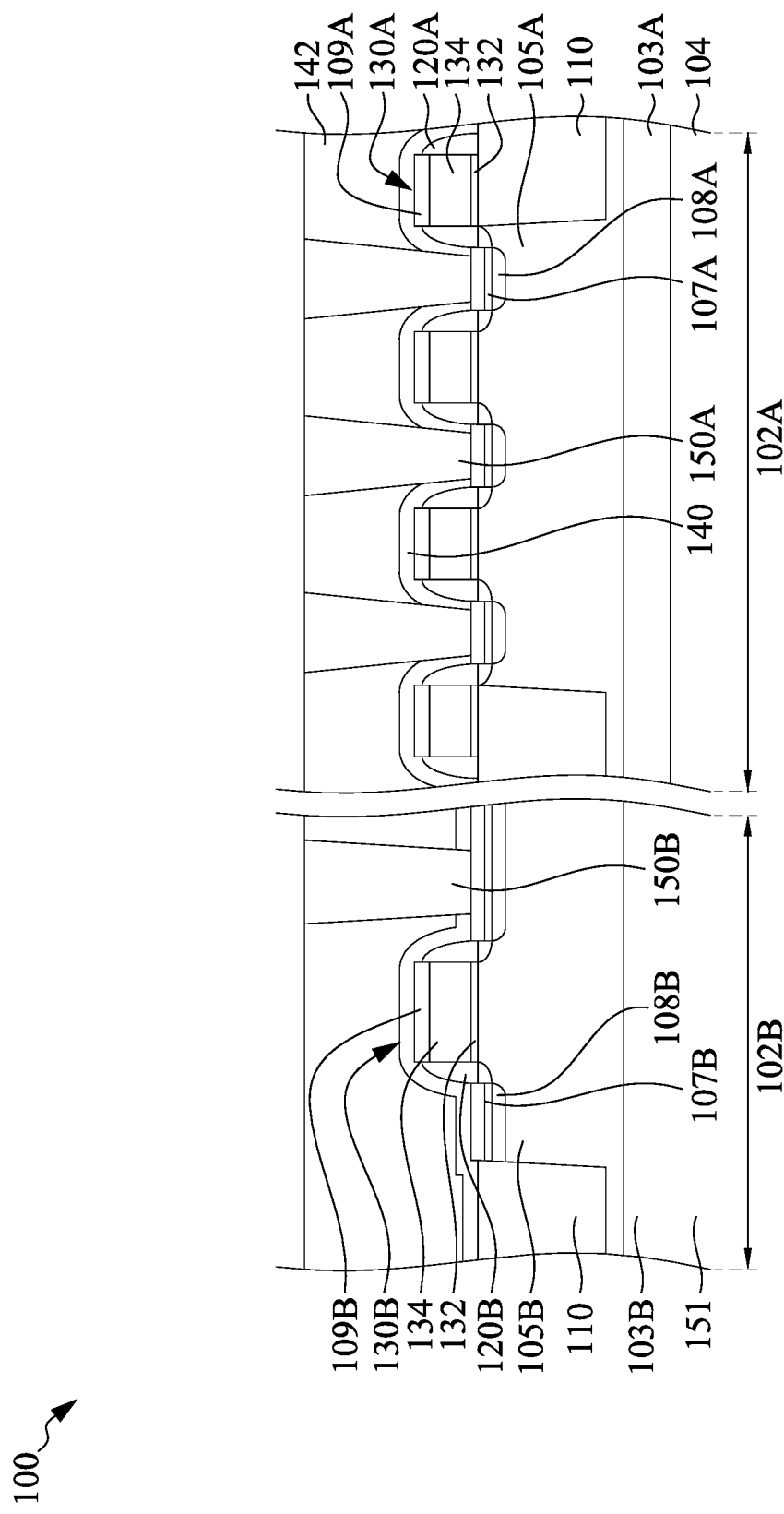

Returning to FIG. 1A, the method M1 then proceeds to block S109 where source/drain contacts are formed to land on the source/drain features within the memory region and the logic region simultaneously through the CESL and the first ILD layer. With reference to FIG. 10, in some embodiments of block S109, the source/drain contact 150B is then formed to land on the source/drain features 108B on the logic region 102B, and the source/drain contact 150A is then formed to land on the source/drain feature 108A on the memory region 102A through the CESL 140 and the first ILD layer 142. The source/drain contacts 150A and 150B are formed simultaneously by using photolithography, etching and deposition techniques. For example, a first patterned mask may be formed over the first ILD layer 142 and used to etch contact openings that extend through the first ILD layer 142 to expose the source/drain feature 108B on the logic region 102B as well as the source/drain feature 108A on the memory region 102A. Thereafter, one or more metals (e.g., tungsten or copper) are deposited to fill the contact openings in the first ILD layer 142 by using any acceptable deposition technique (e.g., CVD, ALD, PEALD, PECVD, PVD, ECP, electroless plating, or the like, or any combination thereof). Next, a planarization process (e.g., CMP) may be used to remove excess metals from above the top surface of the first ILD layer 142. The resulting conductive plugs fill the contact openings in the first ILD layer 142 and constitute source/drain contact 150A making physical and electrical connections to the source/drain feature 108A within the memory region 102A and the source/drain contact 150B making physical and electrical connections to the source/drain feature 108B within the logic region 102B.

In some embodiments, the source/drain contacts 150A and 150B may be formed of copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), molybdenum nitride (MoN), the like and/or combinations thereof.

Figure 11:
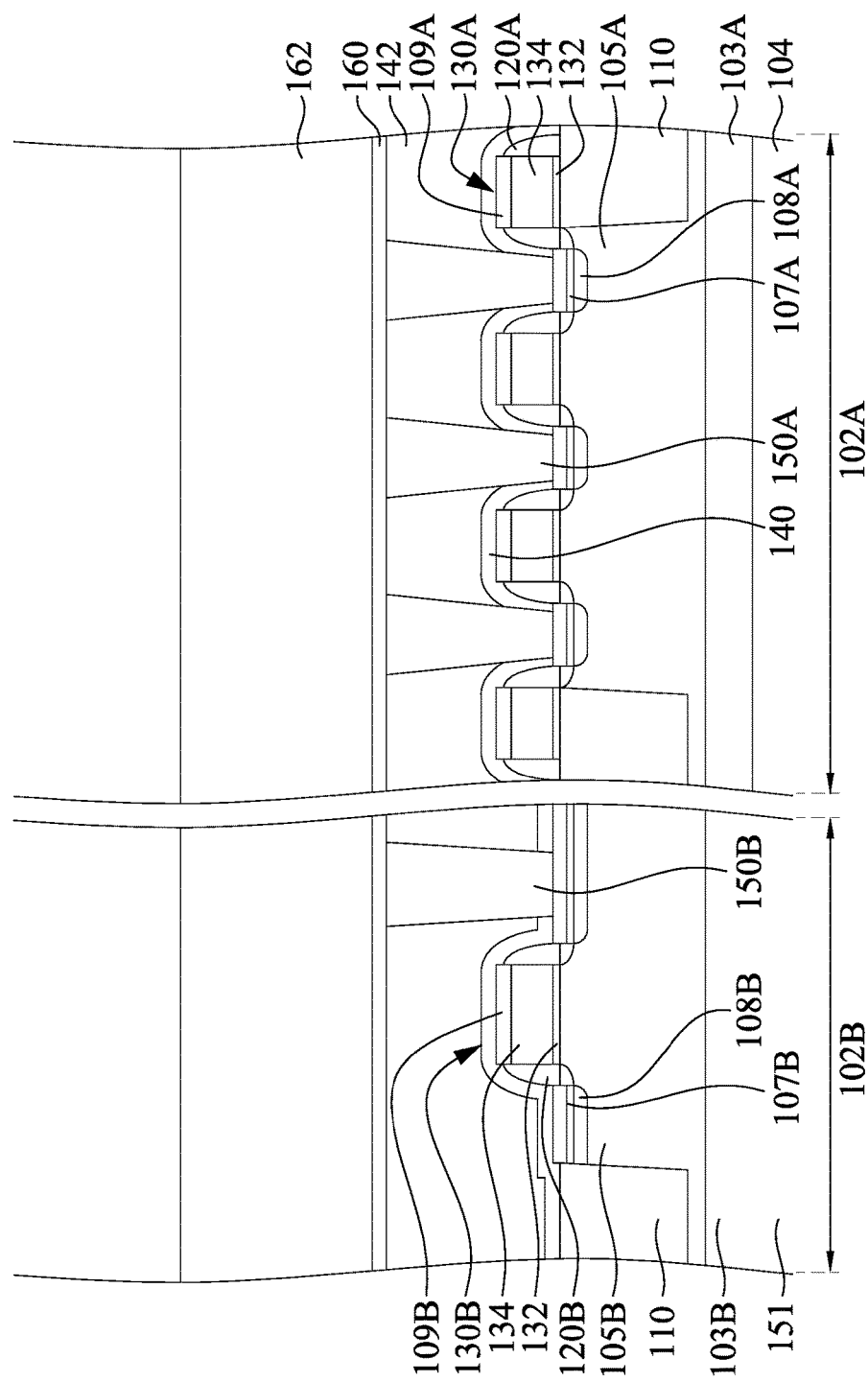

Returning to FIG. 1A, the method M1 then proceeds to block S110 where an etch stop layer (CESL) and a second ILD layer are formed over the CESL within the memory region and the logic region. With reference to FIG. 11, in some embodiments of block S110, an etch stop layer 160 is formed over the first ILD layer 142 within the memory region 102A and the logic region 102B. The etch stop layer 160 may function as an end point of subsequent etching processes as discussed below. Although not limited by the present disclosure, the etch stop layer 502 may comprise silicon carbide, silicon oxide, silicon nitride, or silicon oxynitride, may be formed by CVD, plasma enhanced chemical vapor deposition (PECVD), or low pressure chemical vapor deposition (LPCVD). The etch stop layer may have a thickness ranging from about 500 to about 1500 angstrom (A). For example, in an embodiment in which the etch stop layer 160 comprises silicon carbide, the etch stop layer 502 may be formed by PECVD employing a process chemistry comprising trimethylsilane.

Subsequently, a second ILD layer 162 is formed over the etch stop layer 16 on the memory region 102A and the logic region 102B. The second ILD layer 162 may be also referred to as a crown oxide which is used to form a memory structure therein in a subsequent process. In some embodiments, the second ILD layer 162 may be formed of a material different than the first ILD layer 140. In some embodiments, the second ILD layer 162 may be formed of a similar material as the first ILD layer 140. By way of example but not limiting the present disclosure, the second ILD layer 162 may be made of silicon oxide, silicon nitride, silicon oxynitride, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the second ILD layer 162 may be deposited using any suitable method, such as CVD, physical vapor deposition (PVD), ALD, PEALD, PECVD, SACVD, FCVD, spin-on, and/or the like, or a combination thereof. In some embodiments, the second ILD layer 162 may have a thickness in a range from about 1000 to about 10000 angstrom (A).

Figure 12:
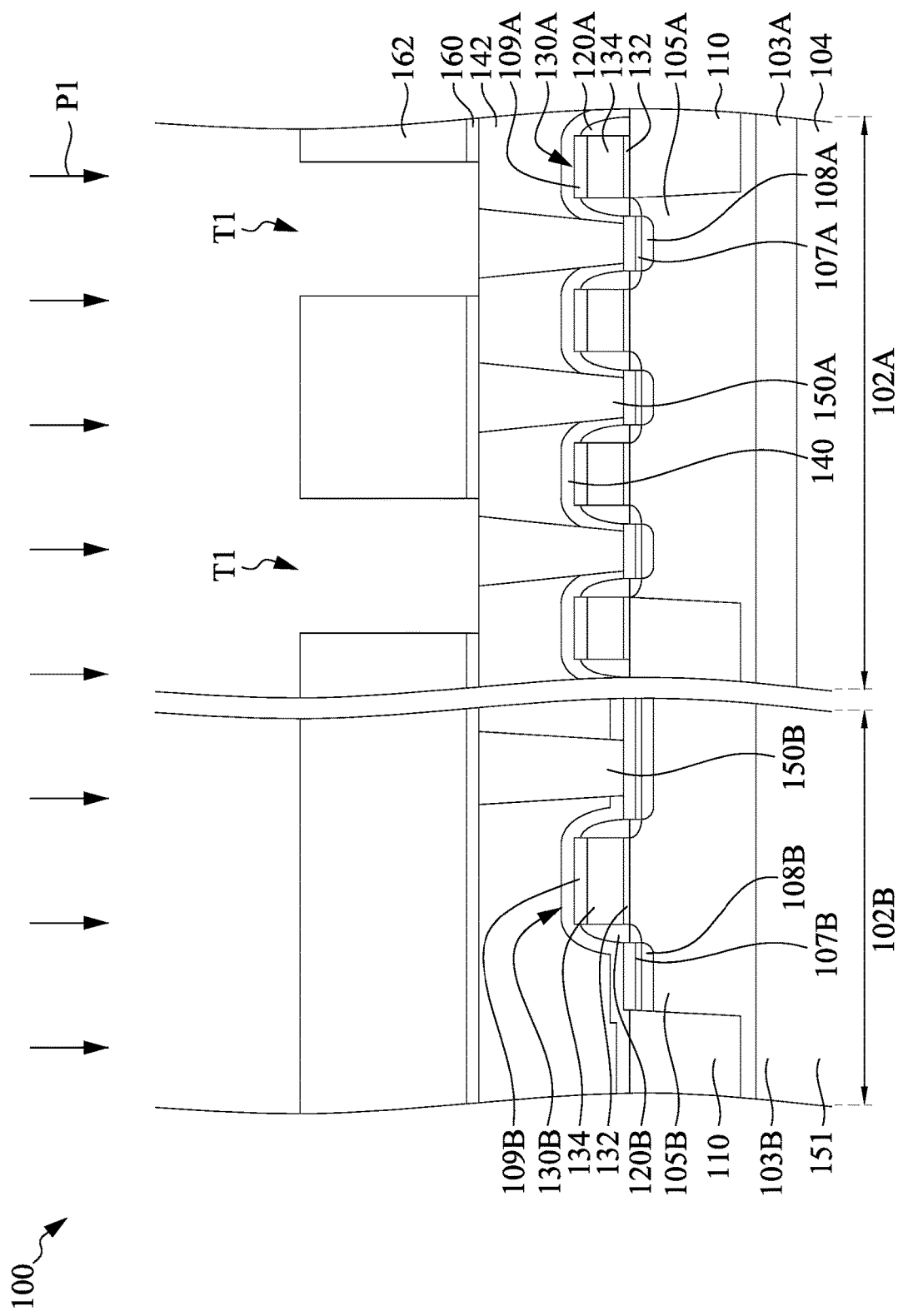

Returning to FIG. 1B, the method M1 then proceeds to block S111 where the CESL and the second ILD layer within the memory region are etched to form a trench that exposes the source/drain contact. With reference to FIG. 12, in some embodiments of block S111, the etch stop layer 160 and the second ILD layer 162 within the memory region 102A are etched to form a trench T1 that exposes the source/drain contact 150A. The trench T1 is formed by using a photolithography and an etching process P1. For example, a second patterned mask may be formed over the second ILD layer 162 and used to protect the second ILD layer 162 within the logic region 102B from the etching process P1. Subsequently, the etching process P1 is performed on the second ILD layer 162 through the second patterned mask and stops until the etch stop layer 160 is reached. The etching process P1 may include a dry etch, a wet etch, a reactive ion etch (RIE), or combination dry. Subsequently, the etch stop layer 160 in the trench T1 is removed by an etching process thereby exposing the source/drain contact 150A. The etching process that is used to remove the etch stop layer 160 may include a dry etch, dry etch, or combination wet and dry etch process. By way of example but not limiting the present disclosure, the etching process used to remove the etch stop layer 160 may include a dry etch process that has a high etching selectivity of silicon carbide to remove the exposed etch stop layer 160. Accordingly, the source/drain contact 150A is exposed in the trench T1. The second patterned mask subsequently stripped, such as by wet stripping or plasma ashing.

Figure 13:
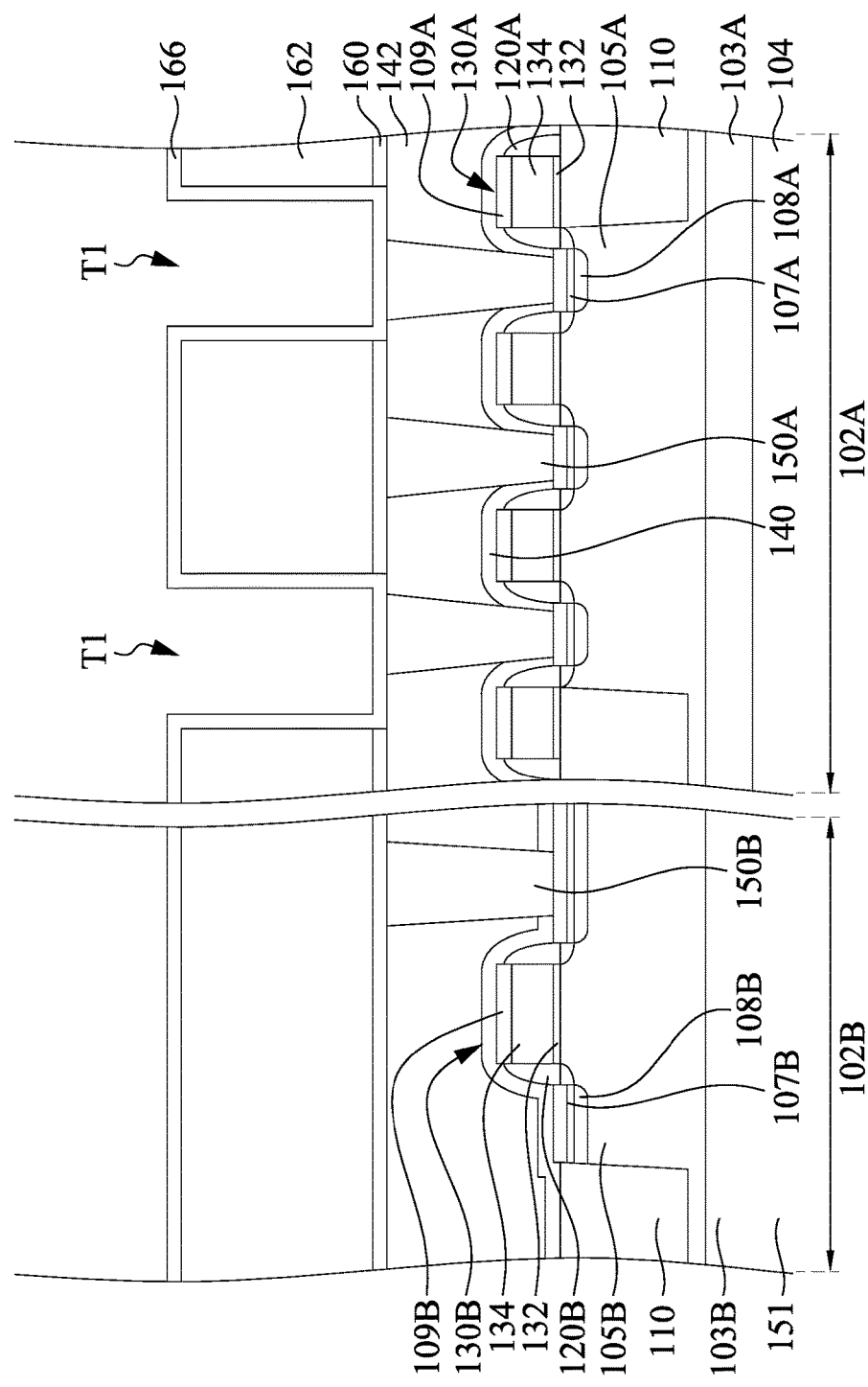

Returning to FIG. 1B, the method M1 then proceeds to block S112 where a bottom electrode layer is conformally formed over the second ILD layer and in contact with the source/drain contact that exposes by the trench. With reference to FIG. 13, in some embodiments of block S112, a bottom electrode layer 166 is conformally formed over the second ILD layer 162 and in contact with the source/drain contact 150A that exposes by the trench T1. Specifically, the bottom electrode layer 166 lines a sidewall of the trench T1 and top surfaces of the source/drain contact 150A and the second ILD layer 162. Although not limited by the present disclosure, the bottom electrode layer 166 may have a thickness ranging from about 20 to about 200 angstrom (A). In some embodiments, the bottom electrode layer 166 may include copper, Pt, Ru, aluminum, tantalum, tungsten, tantalum nitride (TaN), titanium, titanium nitride (TiN), combinations thereof, or other suitable materials. In some embodiments, the bottom electrode layer 566 may be formed by suitable processes such as plating, chemical vapor deposition (CVD), physical vapor deposition (PVD), atomic layer deposition (ALD), the like, and/or other suitable technique. In some embodiments, the bottom electrode layer 166 may include a stack of two or more layers, such as a titanium nitride/titanium or titanium nitride/tungsten.

Figure 14:
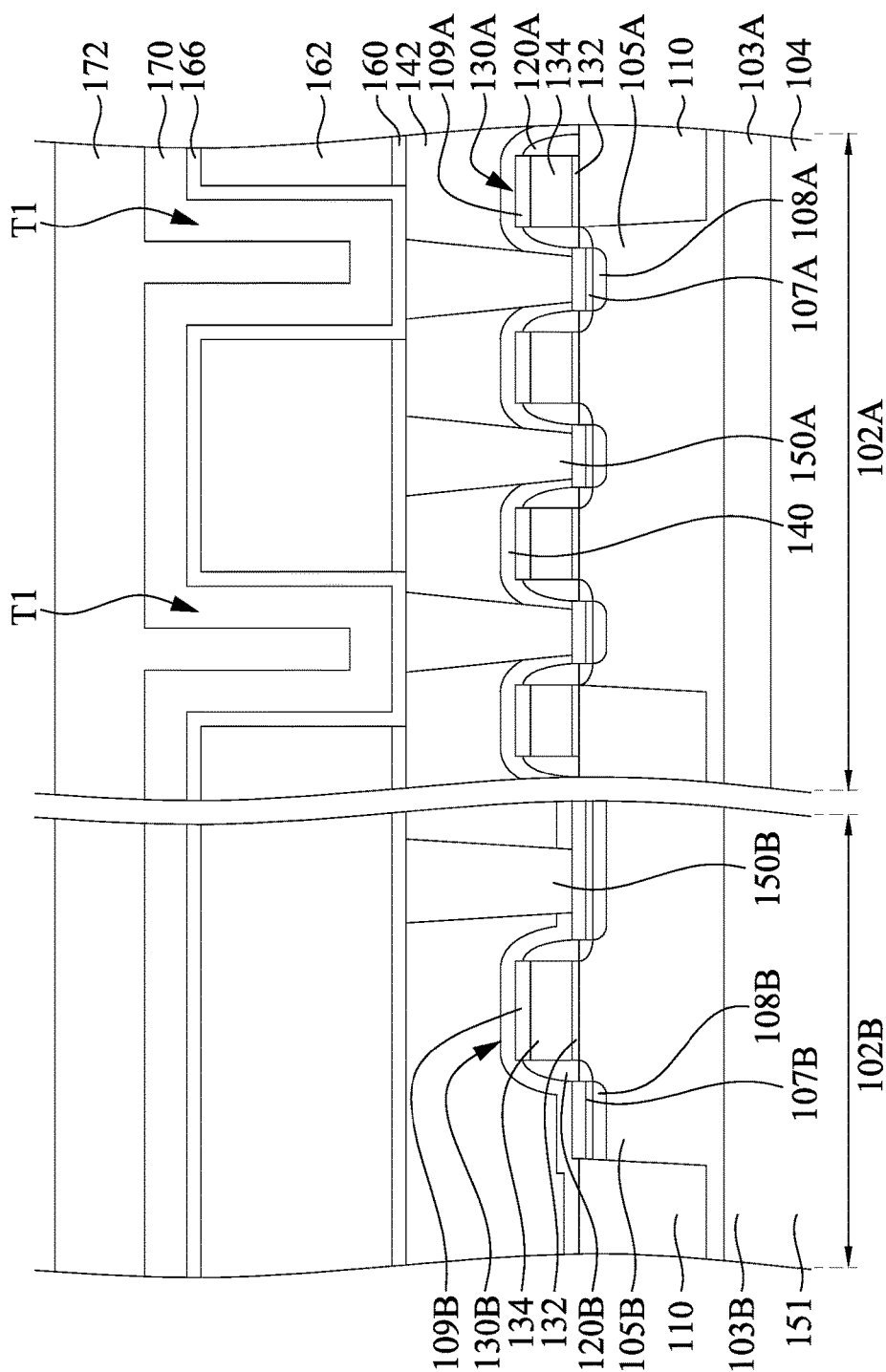

Returning to FIG. 1B, the method M1 then proceeds to block S113 where at least one sacrificial layer is formed over the bottom electrode layer. With reference to FIG. 14, in some embodiments of block S113, first and second sacrificial layers 170 and 172 are formed over the bottom electrode layer 166. By way of example but not limiting the present disclosure, the first sacrificial layer 170 may be an antireflective coating (ARC) layer and the 172 may be a photo resist layer. This is described in greater detail with reference to FIG. 14 in some embodiments where the first sacrificial layer 170 is an ARC layer, an ARC composition is conformally formed over the bottom electrode layer 166 and in the trench T1. Specifically, the ARC composition may include a polymer, a least one thermal add generator (TAG), and an optional crosslinker. The polymer includes a polymer backbone; a crosslinkable group; and a chromophore for absorbing a radiation in the upcoming lithography patterning process, alternative embodiments, the polymer can form crosslinks by itself, in which case a crosslinker is not required. The ARC composition may be dissolved in a solvent as a mixture. In some embodiments, the dissolved ARC composition is applied onto the bottom electrode layer 166 by a spin coating process.

Subsequently, the ARC composition may be cured using, such as a radiation process by an ultraviolet (UV) light or a baking process at certain temperature. The ARC composition crosslinks (or be cured) to form an ARC layer. The crosslinking reaction causes the polymers to connect with each other through either the crosslinkable groups of the polymers and/or through the optional crosslinker. The crosslinking reaction may further drive out the solvent. As a result, the ARC composition solidifies and becomes the dense ARC layer. In some embodiments, the crosslinking reaction can be effectuated by radiating the ARC composition with an ultraviolet (UV) radiation, such as from about 10 nm to about 400 nm. This may be performed at room temperature. In some embodiments, the crosslinking reaction includes baking the ARC composition at a temperature that is sufficient to trigger the generation of the acid to crosslink the ARC composition. By way of example but not limiting the present disclosure, the baking is performed at a temperature greater than about 150 degrees Celsius to crosslink the ARC composition. If the temperature is lower than about 150 degrees Celsius, the crosslinking reaction associated with the polymer inside the ARC composition may not be triggered by the thermal acid generator.

This is described in greater detail with reference to FIG. 14 in some embodiments where the second sacrificial layer 172 is a photo resist layer, the photo resist layer is formed over the first sacrificial layer 170 and in the trench T1. In some embodiments, the photo resist layer is a DIN resist such as a krypton fluoride (KrF) resist or an argon fluoride (ArF) resist. In some embodiments, the photo resist layer is an I-line resist, a EUV resist, an electron beam (e-beam) resist, or an ion beam resist. In some embodiments, the photo resist layer is a positive resist. The positive resist is insoluble in a developer but becomes soluble upon radiation. One exemplary positive resist is a chemically amplified resist (CAR) that contains backbone polymer protected by acid labile groups (ALGs) and further contains photo-acid generators (PAGs). The PAGs can produce an acid upon radiation and the acid can catalyze the cleaving of the ALGs from the backbone polymer, increasing the polymer's solubility to a positive tone developer. In some embodiments, the photo resist layer is a negative resist. The negative resist is soluble in a developer but becomes insoluble upon radiation. In some embodiments, the photo resist layer is formed by spin coating a resist material, followed by a baking process, such as a soft baking process and a hard baking process (may be also referred to as a pre-exposure baking).

By way of example and not limitation, the soft baking process and/or the hard baking process is performed at or below about 120 degrees Celsius. In some embodiments, the soft baking process and/or the hard baking process is performed at or below about 150 degrees Celsius. Subsequently, the photo resist layer is exposed to a radiation through a mask. In some embodiments, the radiation is a DUI/radiation such as KrF excimer laser (248 nm) or ArF excimer laser (193 nm). Alternatively, the radiation may be an I-line (365 nm), a EUV radiation (e.g., 13.8 nm), an e-beam, an x-ray, an ion beam, or other suitable radiations. The radiation causes the PAGs in the photo resist layer to produce an acid. The exposure may be performed in air, in a liquid (immersion lithography), or in a vacuum (e.g., for lithography and e-beam lithography). In some embodiments, the chromophore in the first sacrificial layer 170 may be tuned to absorb the radiation that passes through the photo resist layer, thereby reducing reflections of the radiation off of the complicated topography on the second ILD layer 162. This improves the resist pattern's uniformity. In some embodiments, after exposing the photo resist layer to the radiation, the exposed photo resist layer undergoes one or more post-exposure baking (PEB) processes. In some embodiments, the PEB process is performed at or below about 150 degrees Celsius.

Figure 15:
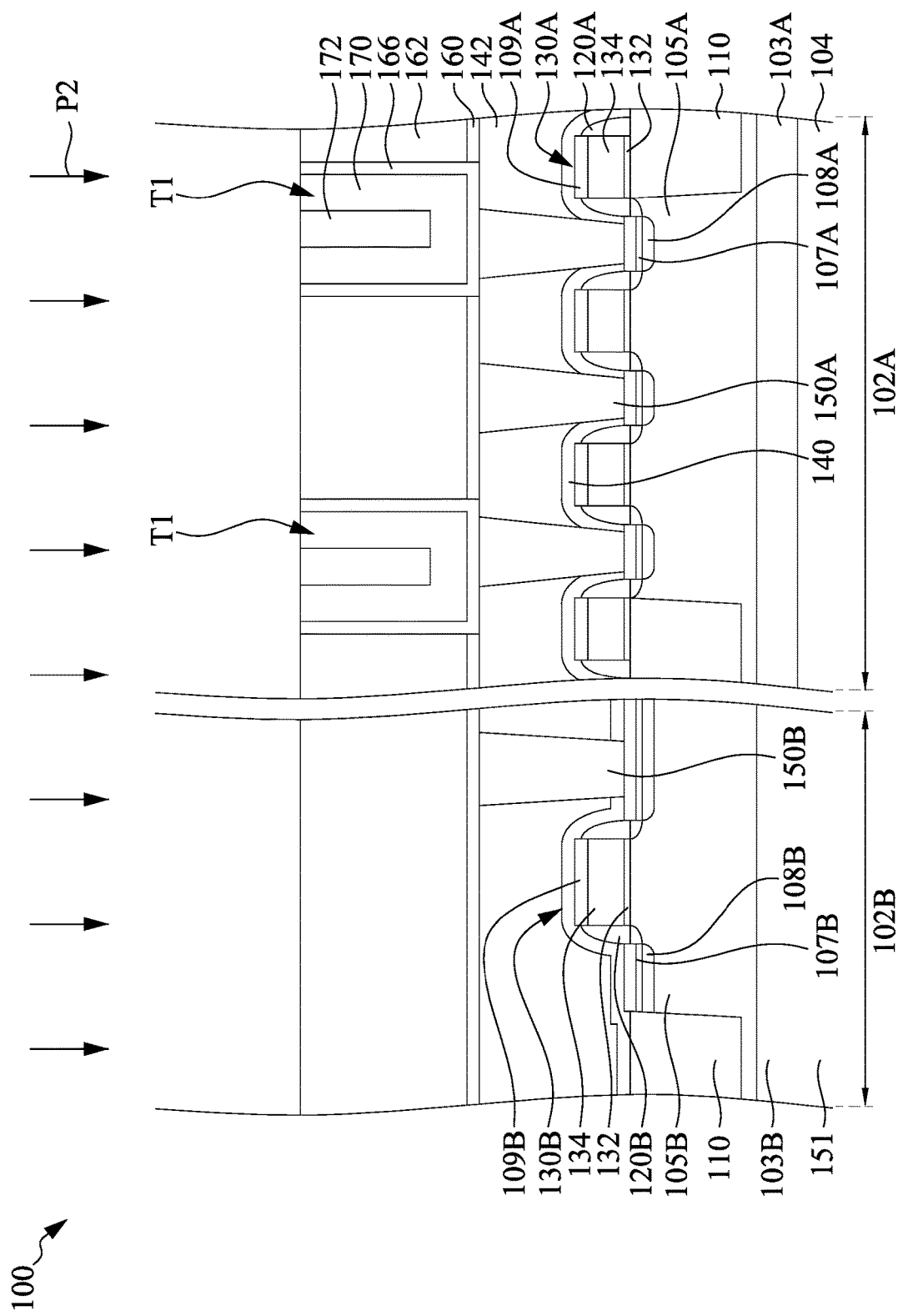

Returning to FIG. 1B, the method M1 then proceeds to block S114 where a planarization process is performed to the at least one sacrificial layer and the bottom electrode layer until the second ILD layer is exposed. With reference to FIG. 15, in some embodiments of block S114, a planarization process P2 such as chemical mechanical polish (CMP) is performed to remove portions of the first and second sacrificial layers 170 and 172 and the bottom electrode layer 166 over the second ILD layer 162. In such embodiments, the second ILD layer 162 may act as the CMP stop layer in the planarization. In greater detail, the CMP process uses slurry that removes the bottom electrode material and/or the sacrificial material at a faster removal rate than it removes the material of second ILD layer 162 (e.g., SiOx). Accordingly, the bottom electrode layer 166 is formed in the trench T1 within the memory region 102A. The bottom electrode layer 166 is electrically coupled to the source/drain feature 108A of a transistor via the source/drain contact 150A within the memory region 102A. In some embodiments, the bottom electrode layer 166 has an U-shaped when viewed in a cross section.

Figure 16:
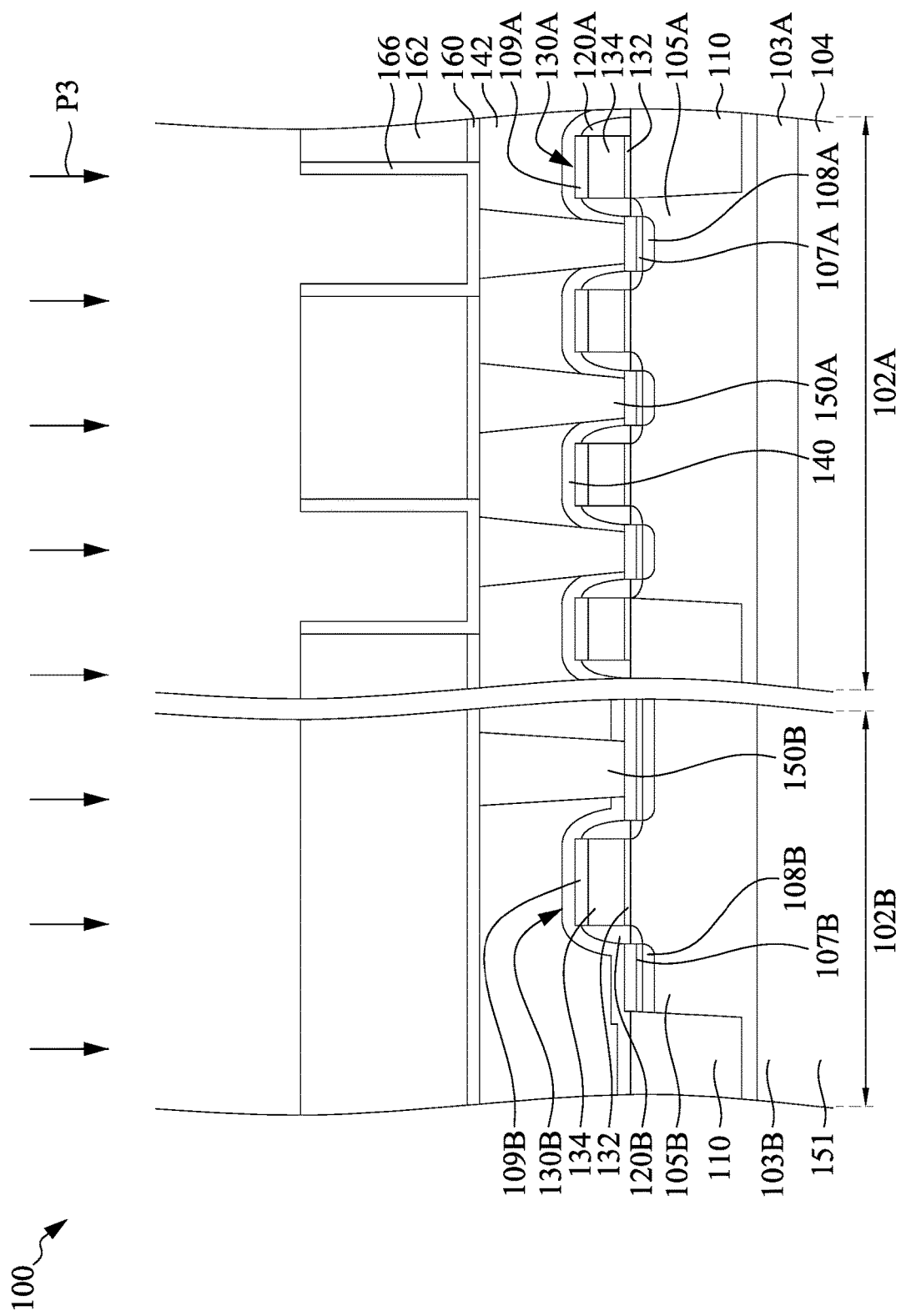

Returning to FIG. 1B, the method M1 then proceeds to block S115 where the at least one sacrificial layer is removed. With reference to FIG. 16, in some embodiments of block S115, an ashing process P3 is performed to remove the first and second sacrificial layers 170 and 172 from the surface of the bottom electrode layer 166. The first and second sacrificial layers 170 and 172 may be removed by for example, ashing in an oxygen ($O_2$) plasma and wet-etch solution including $H_2SO_4/H_2O_2$. In some embodiments, the ashing step P3 may be performed at a temperature that is in a range from about 25 to about 100 degrees Celsius. In some embodiments, if the ashing step P3 performs at a temperature greater than about 100° C., then in turn adversely affects the performance of the semiconductor device. In some embodiments, if the ashing step P3 performs at a temperature less than about 25° C., then residue of the first and second sacrificial layers 170 and 172 may remain on the bottom electrode layer 166.

Figure 17:
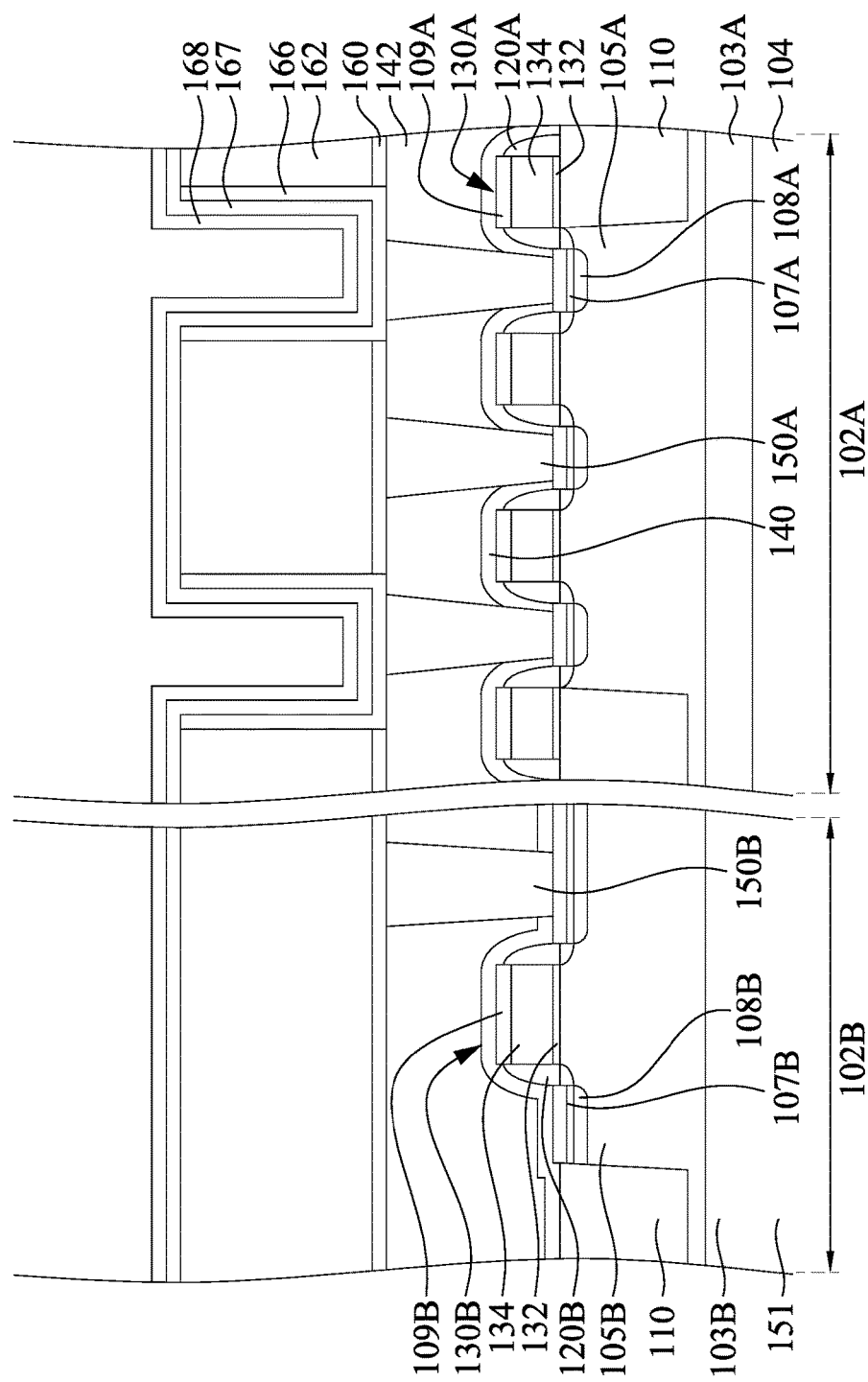

Returning to FIG. 1B, the method M1 then proceeds to block S116 where a ferroelectric layer and a top electrode layer are conformally formed over the second ILD layer and the bottom electrode layer. With reference to FIG. 17, in some embodiments of block S116, a ferroelectric layer 167 is conformally formed over the second dielectric layer and the bottom electrode layer. With reference to FIG. 17, a ferroelectric layer 167 is conformally formed over the second ILD layer 162 and the bottom electrode layer 166. In some embodiments, the ferroelectric layer 167 may include ferroelectric materials, for example, HfO2, HfSiOx, HfZrOx, Al2O3, TiO2, LaOx, BaSrTiOx (BST), PbZrxTiyOz (PZT), doped hafnium oxide (Si:HfO$_2$), the like, or combinations thereof. In some embodiments, the ferroelectric layer 167 may be formed by chemical vapor deposition (CVD), such as high density plasma CVD (HDPCVD), plasma enhanced CVD (PECVD), atomic layer deposition (ALD), plasma enhanced ALD (PEALD), combinations thereof, and other suitable techniques.

It is appreciated that although some of the candidate materials (such as HfSiOx, HfZrOx, Al2O3, TiO2, and LaOx) of the ferroelectric layer 167 includes the same elements as some high-k dielectric materials, the ferroelectric layer 167 has different properties than high-k dielectric materials. For example, the ferroelectric layer 167 may have a resistivity lower than the respective high-k dielectric material that contains the same type of elements. The ferroelectric layer 167 may still be a dielectric layer, except that if it is used as a gate dielectric, the leakage current will be high. Accordingly, the ferroelectric layer 167 may not be suitable to be used as a gate dielectric even if it may also include the same elements as some known high-k dielectric materials. For example, the hafnium oxide ferroelectric layer 167 includes hafnium oxide doped with silicon or zirconium. In addition, the atomic percentages in the ferroelectric layer 167 may be different from the respective high-k dielectric materials that include the same elements. Alternatively stated, the composition (reflecting the type of elements and the percentages of the elements) of the ferroelectric layer 167 may be different from a high-k dielectric material even if they include the same elements. For example, HfSiOx, when used as a high-k material, has a relatively low atomic percentage ratio PHf/PSi, which may be smaller than about 10, wherein PHf is the atomic percentage of hafnium, and PSi is the atomic percentage of silicon. When used to form the ferroelectric layer 167, however, HfSiOx is Hf rich and Si poor. For example, the atomic percentage ratio PHf/PSi in the respective ferroelectric HfSiOx may be increased to greater than about 10, and may be in the range between about 10 and about 100.

Subsequently, the top electrode layer 168 is conformally formed over the ferroelectric layer 167. In some embodiments, the top electrode layer 168 may be formed by suitable processes such as plating, chemical vapor deposition (CVD), physical vapor deposition (PVD) and/or the like. In some embodiments, the top electrode layer 168 may include copper, Pt, Ru, aluminum, tantalum, tungsten, tantalum nitride (TaN), titanium, titanium nitride (TiN), combinations thereof, or other suitable materials. In some embodiments, the top electrode layer 168 has recesses R1 at its topmost surface due to nature of deposition. Although not limited by the present disclosure, the ferroelectric layer 167 may have a thickness ranging from about 50 to about 200 angstrom (A). The top electrode layer 168 may have a thickness ranging from about 20 to about 200 angstrom (A).

Figure 18:
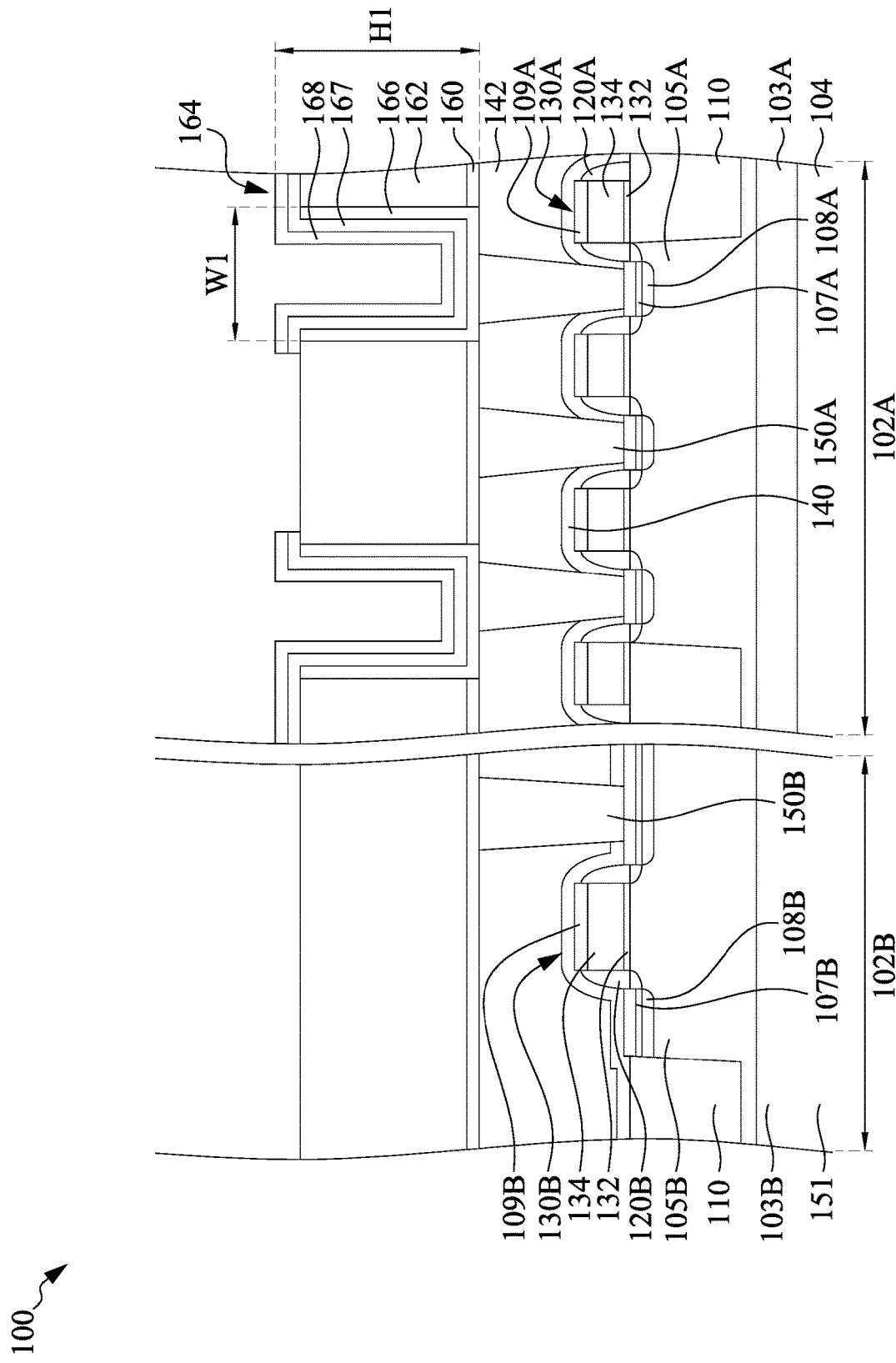

Returning to FIG. 1B, the method M1 then proceeds to block S117 where the top electrode layer and the ferroelectric layer are patterned. With reference to FIG. 18, in some embodiments of block S117, a third patterned mask is formed over the top electrode layer 168 and patterned to form separated mask portions. Specifically, the third patterned mask layer covers portions of the memory region 102A and exposes entirety of the logic region 102B. In some embodiments, the third patterned mask layer may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). Subsequently, portions of the top electrode layer 168 and the ferroelectric layer 167 are removed until the second ILD layer 162 is exposed through the second patterned mask. In greater detail, one or more etching processes are performed to remove portions of the top electrode layer 168 and the ferroelectric layer 167 of the memory region 102A and entirety of the top electrode layer 168 and the ferroelectric layer 167 of the logic region 102B.

Figure 19:
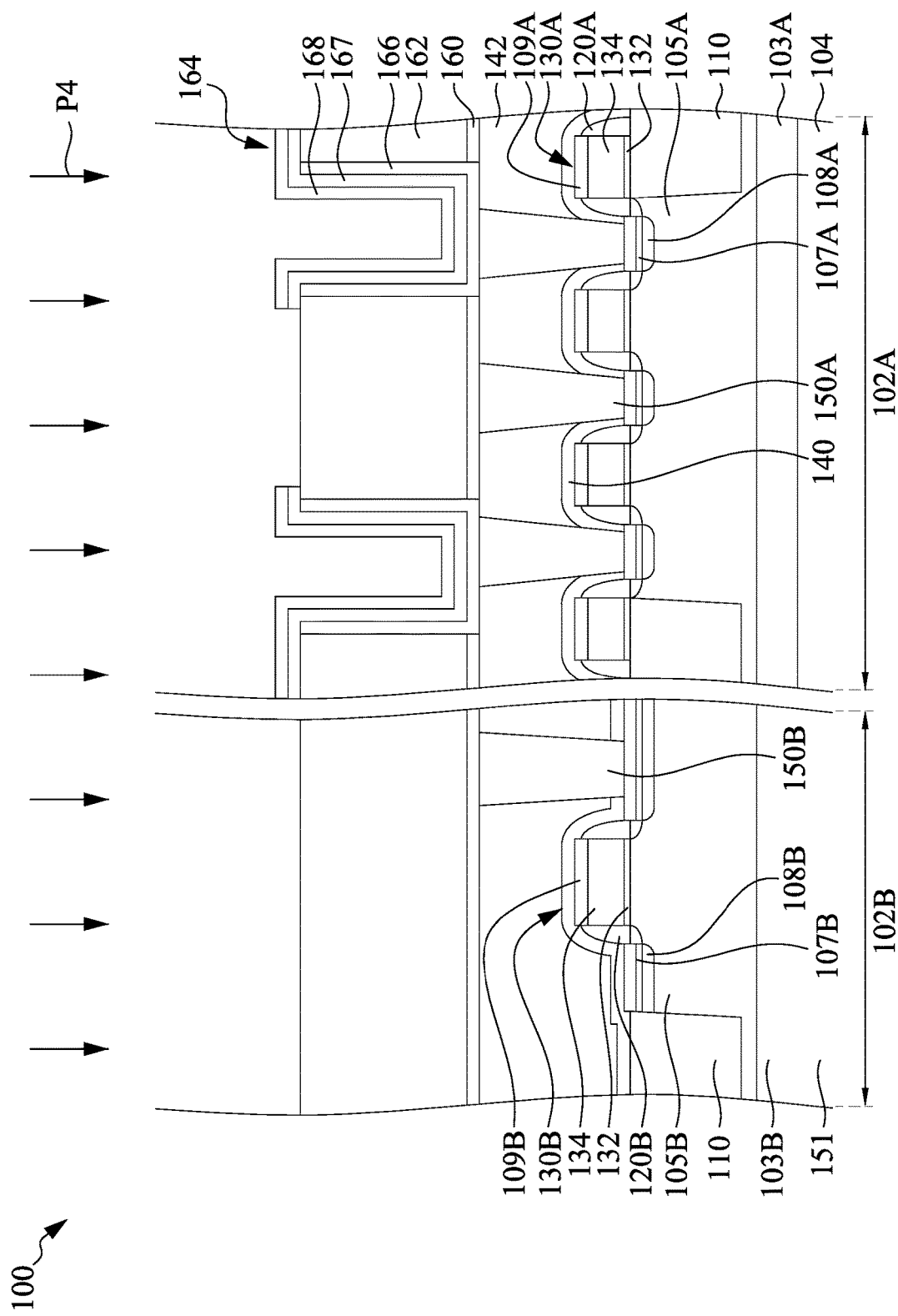

Returning to FIG. 1B, the method M1 then proceeds to block S118 where a heat treatment is performed on the ferroelectric layer to crystallize a ferroelectric material constituting the ferroelectric layer. With reference to FIG. 19, in some embodiments of block S118, a heat treatment P4 is performed on the ferroelectric layer 167 at a high temperature in an oxygen atmosphere to improve the quality of the ferroelectric layer 167, for example, to crystallize a ferroelectric material constituting the ferroelectric layer 167. In some embodiments, the heat treatment P4 may be annealing using a furnace or by Rapid Thermal Annealing (RTA). In some embodiments, the heating temperature is in a range from about 400° C. to about 1000° C., such as about 400, 500, 600, 700, 800, 900, 1000° C.

Accordingly, a FeRAM structure 164 is formed in the trench T1 within the memory region 102A and may be also referred to as a crown-type FeRAM structure. The bottom electrode layer 166 of the FeRAM structure 164 is electrically coupled to the source/drain feature 108A of a transistor within the memory region 102A. This is described in greater detail with reference to FIG. 19, the FeRAM structure 164 includes a bottom electrode layer 166 and a top electrode layer 168, with a ferroelectric layer 167 sandwiched between the bottom and top electrode layers 166 and 168. The FeRAM structure 164 is built on the source/drain contact 150A. The bottom electrode 166 is embedded in the second ILD layer 162 and has a height H1 greater than a width W1 thereof. In FIG. 19, the bottom electrode layer 166 of the FeRAM structure 164 is in contact with the source/drain contact 150A, has a topmost end in a position level with a top surface of the second ILD layer 162, and has an U-shaped cross section. The ferroelectric layer 167 of the FeRAM structure 164 extends along a top surface of the bottom electrode layer 166 and a top surface of second ILD layer 162 laterally across a topmost end of the bottom electrode layer 166 and has an U-shaped cross section. The top electrode layer of the FeRAM structure 164 extends along a top surface of the ferroelectric layer 167 laterally across a topmost end of the bottom electrode layer 166 and has an U-shaped cross section. The top electrode layer 168 has an end surface coterminous with an end surface of the ferroelectric layer 167.

In FIG. 19, an area of an interface between the bottom electrode layer 166 and the ferroelectric layer 167 is greater than an area of an interface between the bottom electrode layer 166 and the source/drain contact 150A and/or an area of an interface between the ferroelectric layer 167 and the top electrode layer 168 is greater than an area of an interface between the bottom electrode layer 166 and the source/drain contact 150A. As such, an effective area of the FeRAM structure 164 is greater than a projection area of the of the FeRAM structure 164 on the semiconductor substrate 151 which in turn allows for improving an effective area and/or enlarging the cell area of the FeRAM structure 164, thereby improving the memory window and reliability of the IC structure 100. In addition, the crown-type FeRAM structure can help to scale down the size of the memory cell.

Furthermore, a heat treatment P4 is performed on the ferroelectric layer 167 at a temperature higher than about 400° C. to improve the ferroelectric characteristic/response of the ferroelectric layer 167 in the FeRAM structure 164. Because the FeRAM structure 164 is built on the source/drain contact 150A which is formed in the MEOL process other than BEOL process, a heat treatment P4 may not in turn adversely affects interconnect structure which is formed in the BEOL process. In some embodiments, if the manufacturing temperature of the interconnect structure formed in the BEOL process is higher than about 400° C., some devices formed on the semiconductor substrate 151 may be destroyed.

Figure 20:
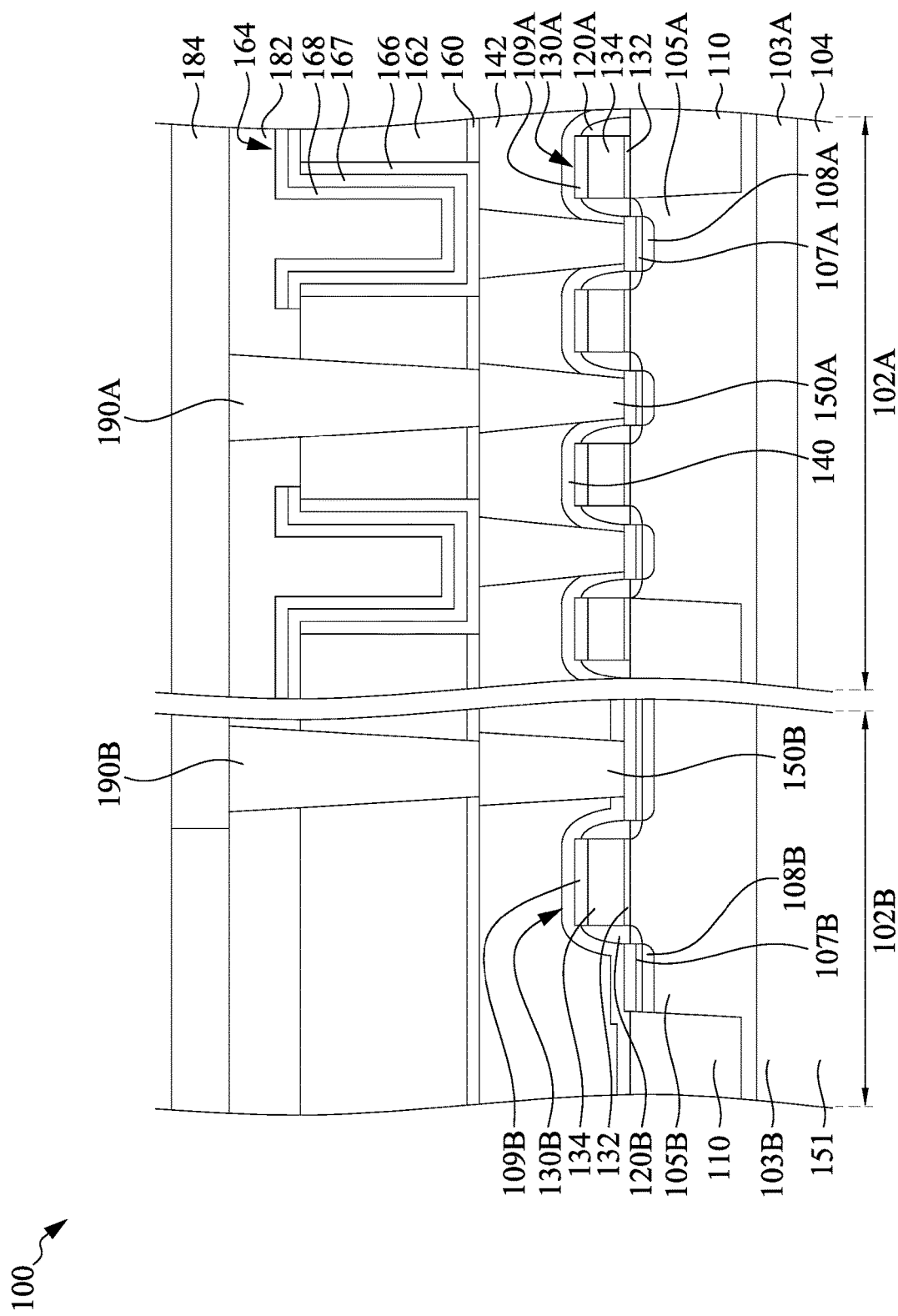

Returning to FIG. 1B, the method M1 then proceeds to block S119 where an interconnect structure is formed to electrically connect the transistors in the memory region and the logic region. With reference to FIG. 20, in some embodiments of block S119, a third ILD layer 182 is formed over the memory region 102A and the logic region 102B and fills in the remainder of the trench T1. In some embodiments, the third ILD layer 182 may be formed of a material different than the second ILD layer 162. In some embodiments, the third ILD layer 182 may be formed of a similar material as the second ILD layer 162. By way of example but not limiting the present disclosure, the third ILD layer 182 may be made of silicon oxide, silicon nitride, silicon oxynitride, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the third ILD layer 182 may be deposited using any suitable method, such as CVD, physical vapor deposition (PVD), ALD, PEALD, PECVD, SACVD, FCVD, spin-on, and/or the like, or a combination thereof.

Subsequently, an interconnect structure is formed to electrically connect the transistors in the memory region 102A and the logic region 102B at a temperature lower than about 400° C. The interconnect structure includes vertical connections (vias/contacts) and horizontal connections (lines). This is described in greater detail with reference to FIG. 20, contacts 190A and 190B are formed to land on the source/drain features 150A and 150B within the memory region 102A and the logic region 102B simultaneously through the second and third ILD layers 162 and 182 and the etch stop layer 160. The contacts 190A and 190B are formed simultaneously by using photolithography, etching and deposition techniques. For example, a fourth patterned mask may be formed over the third ILD layer 182 and used to etch contact openings that extend through the second and third ILD layers 162 and 182 and the etch stop layer 160 to expose the source/drain contact 150B on the logic region 102B as well as the source/drain contact 150A on the memory region 102A. Thereafter, one or more metals (e.g., tungsten or copper) are deposited to fill the contact openings in the first ILD layer 142 by using any acceptable deposition technique (e.g., CVD, ALD, PEALD, PECVD, PVD, ECP, electroless plating, or the like, or any combination thereof). Next, a planarization process (e.g., CMP) may be used to remove excess metals from above the top surface of the third ILD layer 182. The resulting conductive plugs fill the contact openings in the second and third ILD layers 162 and 182 and constitute contact 190A making physical and electrical connections to the source/drain contact 150A within the memory region 102A and the contact 190B making physical and electrical connections to the source/drain contact 150B within the logic region 102B.

Subsequently, a plurality of metal layers (a metal layer 184 is illustrated) and intermetal dielectric for insulating each of the metal layers are formed over the third ILD layer 182 for interconnecting the various devices in memory region 102A and the logic region 102B to form an integrated circuit or system-on-chip (SoC) device. In some embodiments, the contacts 190A and 190B and/or the metal layer 184 may be formed of copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), molybdenum nitride (MoN), the like and/or combinations thereof.

Figure 21:
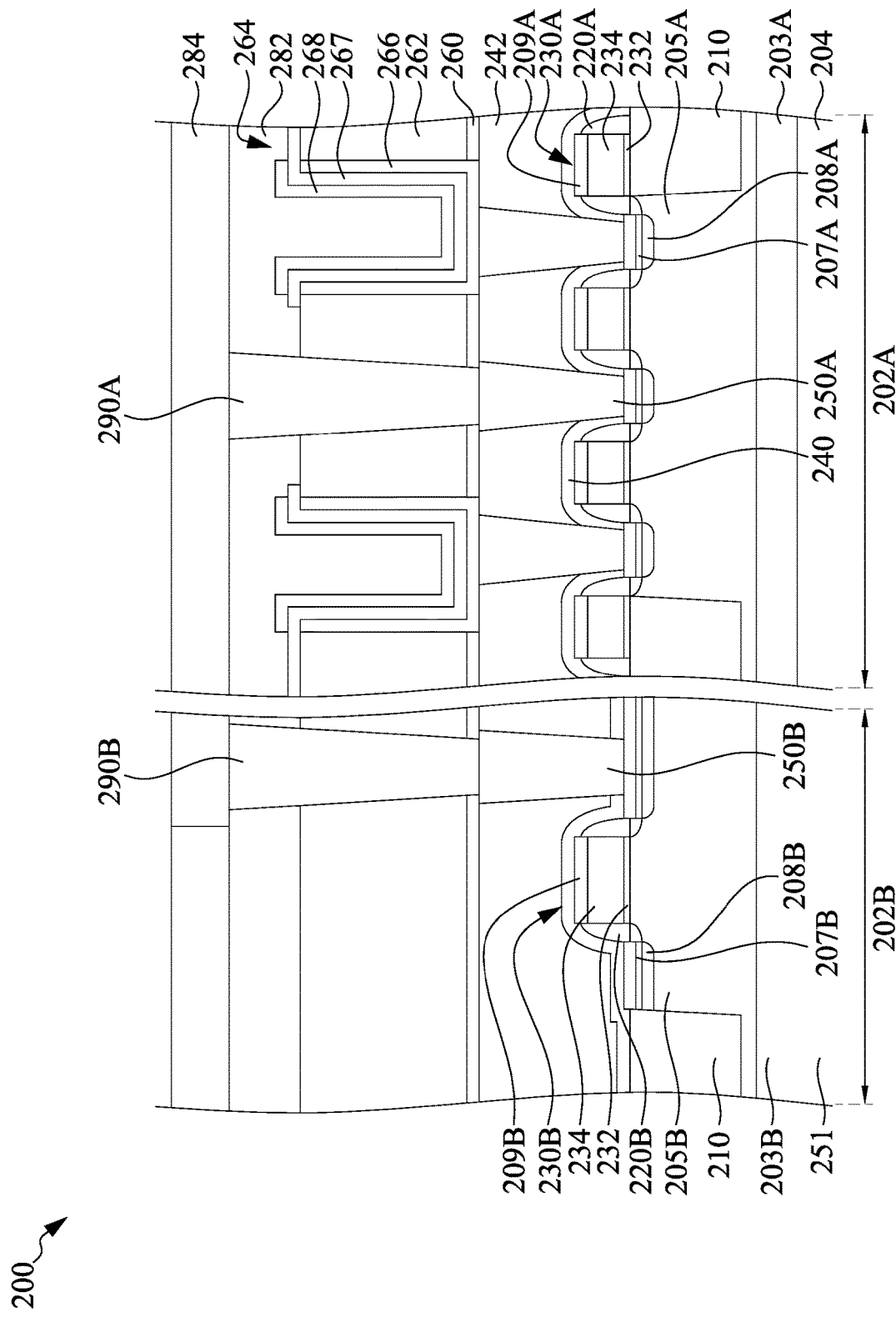
FIG. 21 illustrates an IC structure in accordance with some embodiments of the present disclosure.

FIG. 21 illustrates an IC structure 200 in accordance with some embodiments of the present disclosure. It is noted that some elements are not illustrated in FIG. 21 for brevity. The same or similar configurations and/or materials as described with FIGS. 2 to 20 may be employed in FIG. 21, and the detailed explanation may be omitted. In some embodiments, configurations and/or materials of a semiconductor substrate 251, well regions 203A and 203B, a deep well region 204, gate structures 230A and 230B, doped features 207A and 207B, spacers 220A and 220B, source/drain features 208A and 208B, metal silicide layers 209A and 209B, a CESL 240, a first ILD layer 242, source/drain contacts 250A and 250B, an etch stop layer 260, a second ILD layer 262, a bottom electrode layer 266, a ferroelectric layer 267, a top electrode layer 268, a third ILD layer 282, contacts 290A and 290B, and a metal layer 284 as shown in FIG. 21 may be substantially the same as or comparable to that of the semiconductor substrate 151, the well regions 103A and 103B, the deep well region 104, the gate structures 130A and 130B, the doped features 107A and 107B, the spacers 120A and 120B, the source/drain features 108A and 108B, the metal silicide layers 109A and 109B, the CESL 140, the first ILD layer 142, the source/drain contacts 150A and 150B, the etch stop layer 160, the second ILD layer 162, the bottom electrode layer 166, the ferroelectric layer 167, the top electrode layer 168, the third ILD layer 182, the contacts 190A and 190B, and the metal layer 184 as shown in FIGS. 2 to 20, and the related detailed descriptions may refer to the foregoing paragraphs, and are not described again herein.

The difference between the present embodiment and the embodiment in FIGS. 2 to 20 is that the top electrode layer 268 of the memory cell has an end surface set back from an end surface of the ferroelectric layer 267, such that by-product on the top electrode layer 268 and the ferroelectric layer 267 may be clean to prevent from a top/bottom electrode short. This is described in greater detail with reference to FIG. 21, a fifth patterned mask is formed over the top electrode layer 268 after patterning the top electrode layer 268 and the ferroelectric layer 267 as shown in FIG. 18. The fifth patterned mask layer covers a middle portion of top electrode layer 268 and exposes opposite end portions of the top electrode layer 268. In some embodiments, the fifth patterned mask layer may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). Subsequently, the opposite end portions of the top electrode layer 268 are removed until the underlying ferroelectric layer 267 is exposed through the fifth patterned mask. In greater detail, one or more etching processes are performed to remove the opposite end portions of the top electrode layer 268 to set back the end surface of the top electrode layer 268 from the end surface of the ferroelectric layer 267. The fifth patterned mask subsequently stripped, such as by wet stripping or plasma ashing.

In FIG. 21, an area of an interface between the bottom electrode layer 266 and the ferroelectric layer 267 is greater than an area of an interface between the bottom electrode layer 266 and the source/drain contact 250A and/or an area of an interface between the ferroelectric layer 267 and the top electrode layer 268 is greater than an area of an interface between the bottom electrode layer 266 and the source/drain contact 250A. As such, an effective area of the FeRAM structure 264 is greater than a projection area of the of the FeRAM structure 264 on the semiconductor substrate 251 which in turn allows for improving an effective area and/or enlarging the cell area of the FeRAM structure 264, thereby improving the memory window and reliability of the IC structure 200. In addition, the crown-type FeRAM structure can help to scale down the size of the memory cell. Furthermore, a heat treatment is performed on the ferroelectric layer 267 at a temperature higher than about 400° C. to improve the ferroelectric characteristic/response of the ferroelectric layer 267 in FeRAM structure 264. Because the FeRAM structure 264 is built on the source/drain contact 250A which is formed in the MEOL process other than BEOL process, a heat treatment may not in turn adversely affects interconnect structure which is formed in the BEOL process. In some embodiments, if the manufacturing temperature of the interconnect structure formed in the BEOL process is higher than about 400° C., some devices formed on the semiconductor substrate 251 may be destroyed.

Figure 22:
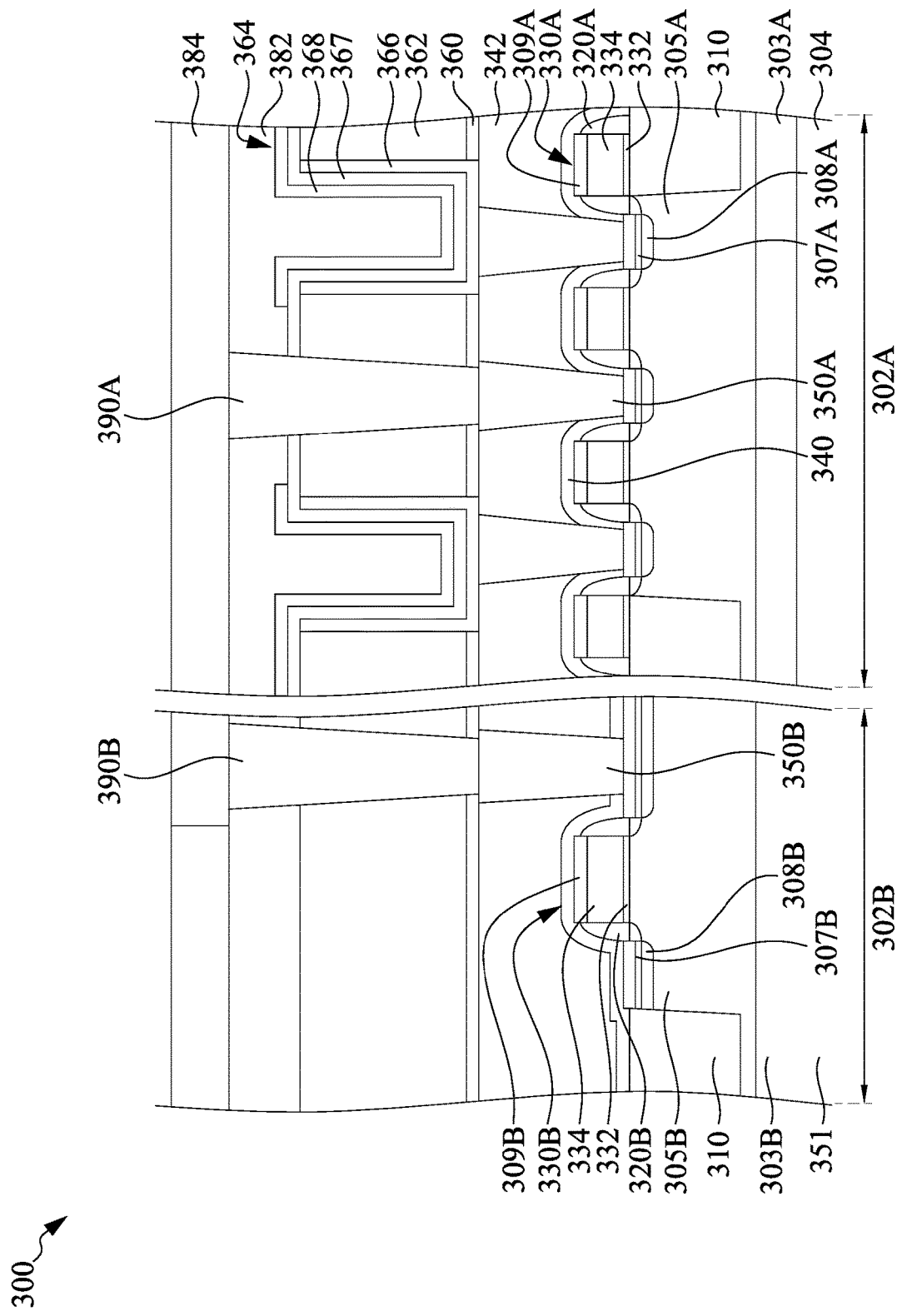
FIG. 22 illustrates an IC structure in accordance with some embodiments of the present disclosure.

FIG. 22 illustrates an IC structure 300 in accordance with some embodiments of the present disclosure. It is noted that some elements are not illustrated in FIG. 22 for brevity. The same or similar configurations and/or materials as described with FIGS. 2 to 20 may be employed in FIG. 22, and the detailed explanation may be omitted. In some embodiments, configurations and/or materials of a semiconductor substrate 351, well regions 303A and 303B, a deep well region 304, gate structures 330A and 330B, doped features 307A and 307B, spacers 320A and 320B, source/drain features 308A and 308B, metal silicide layers 309A and 309B, a CESL 340, a first ILD layer 342, source/drain contacts 350A and 350B, an etch stop layer 360, a second ILD layer 362, a bottom electrode layer 366, a ferroelectric layer 367, a top electrode layer 368, a third ILD layer 382, contacts 390A and 390B, and a metal layer 384 as shown in FIG. 22 may be substantially the same as or comparable to that of the semiconductor substrate 151, the well regions 103A and 103B, the deep well region 104, the gate structures 130A and 130B, the doped features 107A and 107B, the spacers 120A and 120B, the source/drain features 108A and 108B, the metal silicide layers 109A and 109B, the CESL 140, the first ILD layer 142, the source/drain contacts 150A and 150B, the etch stop layer 160, the second ILD layer 162, the bottom electrode layer 166, the ferroelectric layer 167, the top electrode layer 168, the third ILD layer 182, the contacts 190A and 190B, and the metal layer 184 as shown in FIGS. 2 to 20, and the related detailed descriptions may refer to the foregoing paragraphs, and are not described again herein.

The difference between the present embodiment and the embodiment in FIGS. 2 to 20 is that the ferroelectric layer 367 of the memory cell may not be patterned as shown in FIG. 18 and the contact 390A is formed to land on the source/drain features 350A through the ferroelectric layer 367. This is described in greater detail with reference to FIG. 22, the third patterned mask as described in FIG. 18 formed over the top electrode layer 368 is used to patterned the top electrode layer 368 other than the ferroelectric layer 367. Subsequently, the ferroelectric layer 367 on the logic region 302B is removed while the ferroelectric layer 367 on the memory region 302A remains. Accordingly, the contact 390A formed thereafter may penetrate the ferroelectric layer 367 to land on the source/drain features 350A. In other words, the ferroelectric layer 367 extends along a top surface of the second ILD layer 362 and is in contact with the contact 390A within the memory region 302A.

In FIG. 22, an area of an interface between the bottom electrode layer 266 and the ferroelectric layer 367 is greater than an area of an interface between the bottom electrode layer 366 and the source/drain contact 350A and/or an area of an interface between the ferroelectric layer 367 and the top electrode layer 368 is greater than an area of an interface between the bottom electrode layer 366 and the source/drain contact 350A. As such, an effective area of the FeRAM structure 364 is greater than a projection area of the of the FeRAM structure 364 on the semiconductor substrate 351 which in turn allows for improving an effective area and/or enlarging the cell area of the FeRAM structure 364, thereby improving the memory window and reliability of the IC structure 300. In addition, the crown-type FeRAM structure can help to scale down the size of the memory cell. Furthermore, a heat treatment is performed on the ferroelectric layer 367 at a temperature higher than about 400° C. to improve the ferroelectric characteristic/response of the ferroelectric layer 367 in FeRAM structure 364. Because the FeRAM structure 364 is built on the source/drain contact 350A which is formed in the MEOL process other than BEOL process, a heat treatment may not in turn adversely affects interconnect structure which is formed in the BEOL process. In some embodiments, if the manufacturing temperature of the interconnect structure formed in the BEOL process is higher than about 400° C., some devices formed on the semiconductor substrate 351 may be destroyed.

Figure 23:
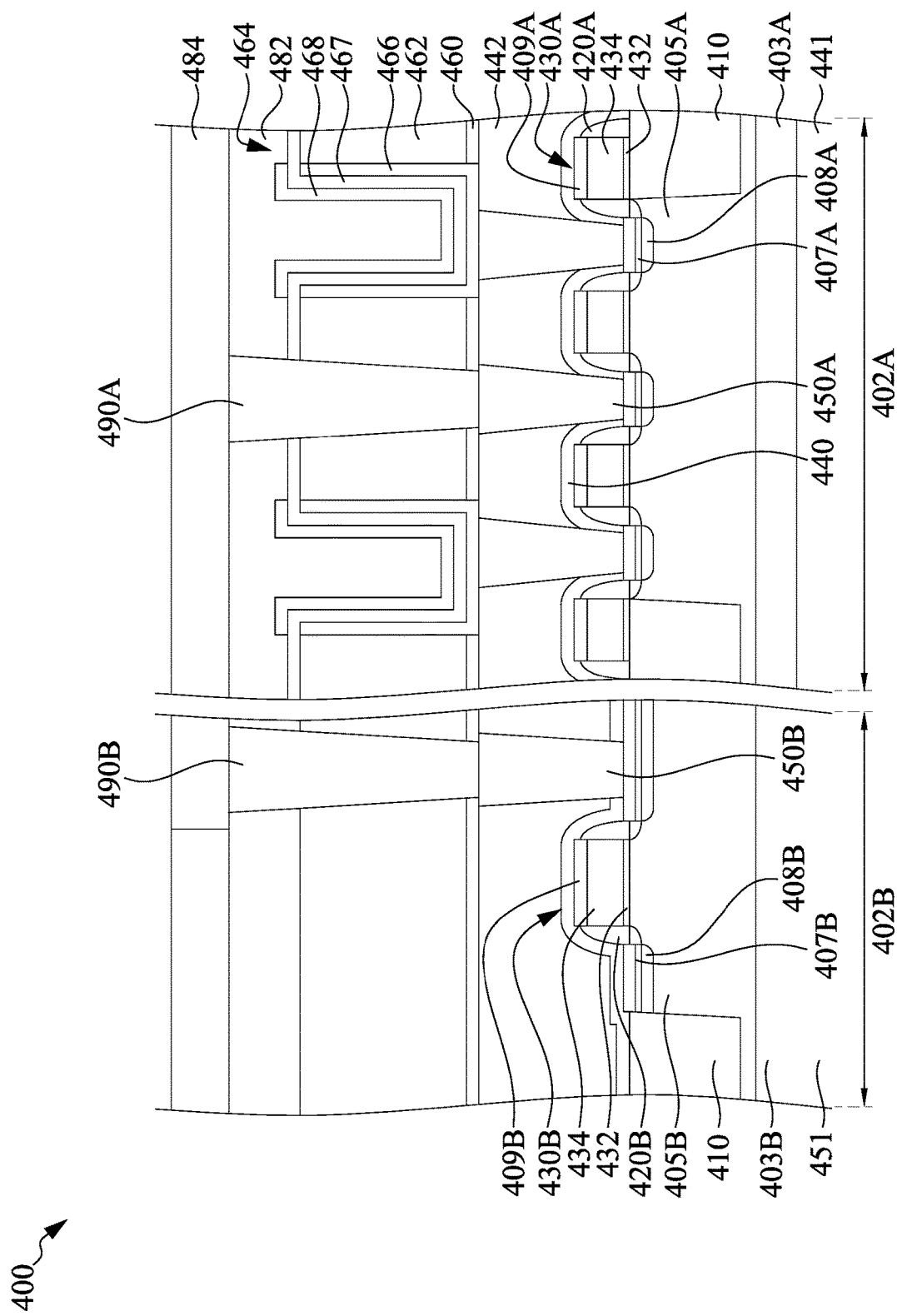
FIG. 23 illustrates an IC structure in accordance with some embodiments of the present disclosure.

FIG. 23 illustrates an IC structure 400 in accordance with some embodiments of the present disclosure. It is noted that some elements are not illustrated in FIG. 23 for brevity. The same or similar configurations and/or materials as described with FIG. 21 may be employed in FIG. 23, and the detailed explanation may be omitted. In some embodiments, configurations and/or materials of a semiconductor substrate 451, well regions 403A and 403B, a deep well region 404, gate structures 430A and 430B, doped features 407A and 407B, spacers 420A and 420B, source/drain features 408A and 408B, metal silicide layers 409A and 409B, a CESL 440, a first ILD layer 442, source/drain contacts 450A and 450B, an etch stop layer 460, a second ILD layer 462, a bottom electrode layer 466, a ferroelectric layer 467, a top electrode layer 468, a third ILD layer 482, contacts 490A and 490B, and a metal layer 484 as shown in FIG. 23 may be substantially the same as or comparable to that of the semiconductor substrate 251, the well regions 203A and 203B, the deep well region 204, the gate structures 230A and 230B, the doped features 207A and 207B, the spacers 220A and 220B, the source/drain features 208A and 208B, the metal silicide layers 209A and 209B, the CESL 240, the first ILD layer 242, the source/drain contacts 250A and 250B, the etch stop layer 260, the second ILD layer 262, the bottom electrode layer 266, the ferroelectric layer 267, the top electrode layer 268, the third ILD layer 282, the contacts 290A and 290B, and the metal layer 284 as shown in FIG. 21, and the related detailed descriptions may refer to the foregoing paragraphs, and are not described again herein.

The difference between the present embodiment and the embodiment in FIG. 21 is that the ferroelectric layer 467 of the memory cell may not be patterned as shown in FIG. 21 and the contact 490A is formed to land on the source/drain features 450A through the ferroelectric layer 467. This is described in greater detail with reference to FIG. 23, the third patterned mask as described in FIG. 18 formed over the top electrode layer 468 is used to patterned the top electrode layer 468 other than the ferroelectric layer 467. Subsequently, the ferroelectric layer 467 on the logic region 402B is removed while the ferroelectric layer 467 on the memory region 402A remains. Accordingly, the contact 490A formed thereafter may penetrate the ferroelectric layer 467 to land on the source/drain features 450A. In other words, the ferroelectric layer 467 extends along a top surface of the second ILD layer 462 and is in contact with the contact 490A within the memory region 402A.

In FIG. 23, an area of an interface between the bottom electrode layer 466 and the ferroelectric layer 467 is greater than an area of an interface between the bottom electrode layer 466 and the source/drain contact 450A and/or an area of an interface between the ferroelectric layer 467 and the top electrode layer 468 is greater than an area of an interface between the bottom electrode layer 466 and the source/drain contact 450A. As such, an effective area of the FeRAM structure 464 is greater than a projection area of the of the FeRAM structure 464 on the semiconductor substrate 451 which in turn allows for improving an effective area and/or enlarging the cell area of the FeRAM structure 464, thereby improving the memory window and reliability of the IC structure 400. In addition, the crown-type FeRAM structure can help to scale down the size of the memory cell. Furthermore, a heat treatment is performed on the ferroelectric layer 467 at a temperature higher than about 400° C. to improve the ferroelectric characteristic/response of the ferroelectric layer 467 in FeRAM structure 464. Because the FeRAM structure 464 is built on the source/drain contact 450A which is formed in the MEOL process other than BEOL process, a heat treatment may not in turn adversely affects interconnect structure which is formed in the BEOL process. In some embodiments, if the manufacturing temperature of the interconnect structure formed in the BEOL process is higher than about 400° C., some devices formed on the semiconductor substrate 451 may be destroyed.

Figure 24A:
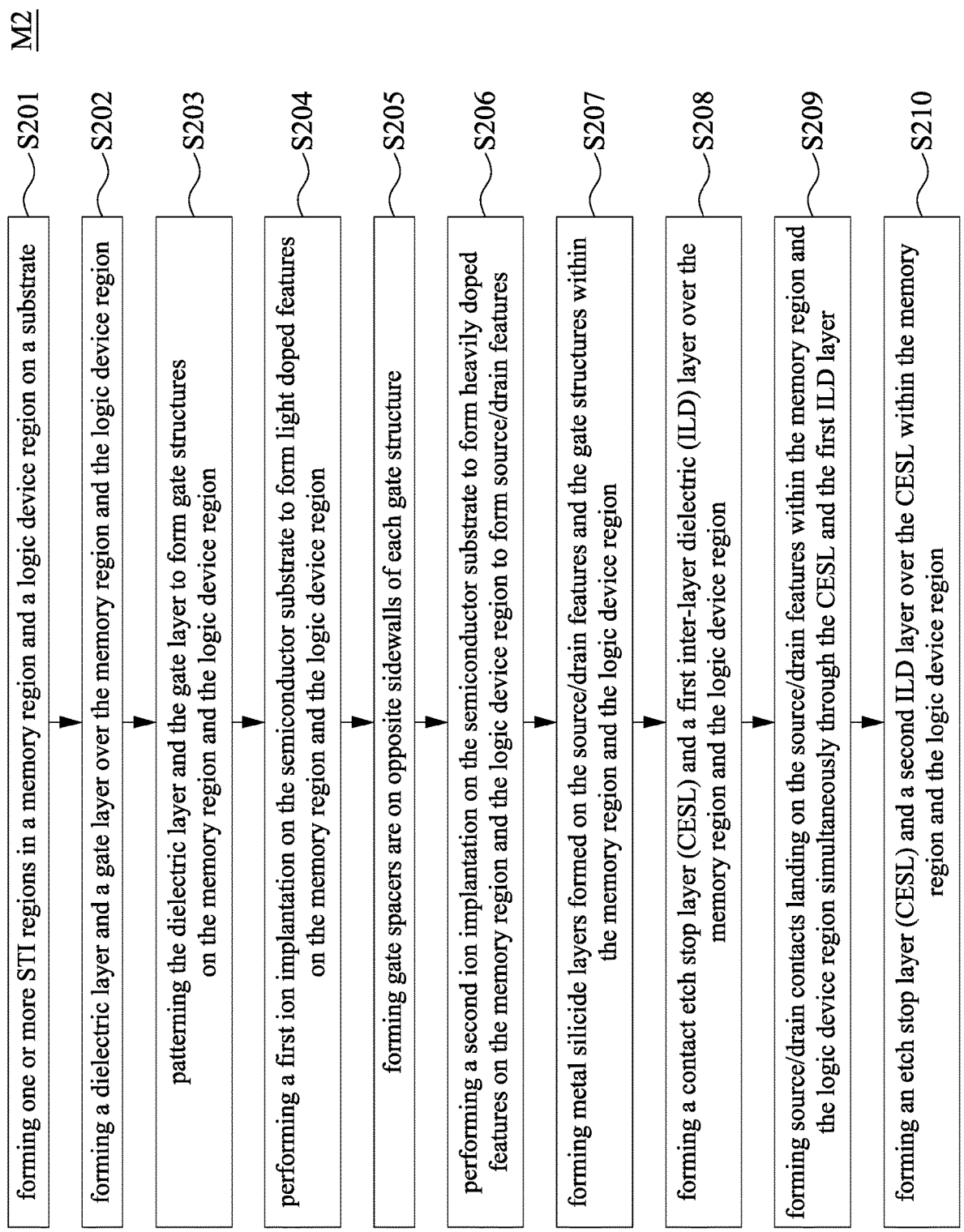
FIGS. 24A and 24B are flow charts of a method for forming an IC structure in accordance with some embodiments of the present disclosure.
Figure 24B:
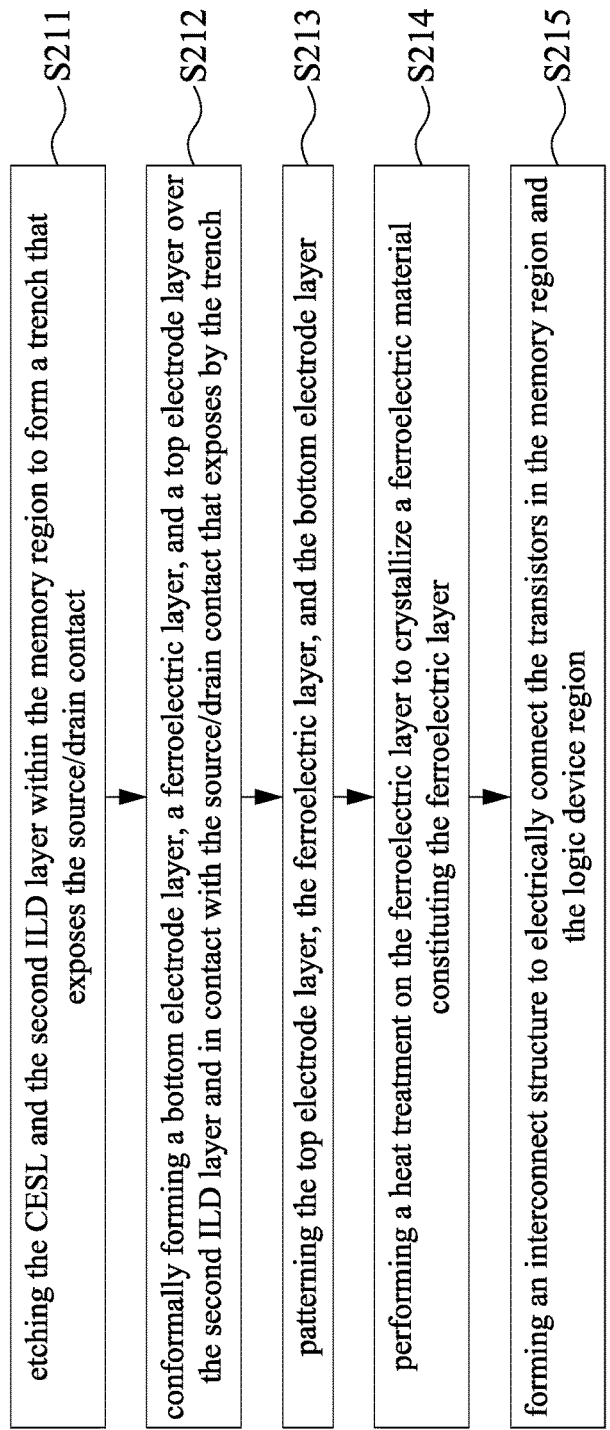

FIGS. 24A and 24B are flow charts of a method for forming an IC structure in accordance with some embodiments of the present disclosure. The method M2 includes a relevant part of the entire manufacturing process. It is understood that additional operations may be provided before, during, and after the operations shown by FIGS. 24A and 24B, and some of the operations described below can be replaced or eliminated for additional embodiments of the method. The order of the operations/processes may be interchangeable. It is noted that FIGS. 24A and 24B have been simplified for a better understanding of the disclosed embodiment.

FIGS. 25 to 29 illustrate an IC structure 500 at various stages of the method M2 according to some embodiments of the present disclosure. Operations for forming the IC structure 500 prior to the structure shown in FIG. 25 at stages S201-S211 of the method M2 are substantially the same as the operations for forming the IC structure 100 shown in FIGS. 2-12 at stages S101-S111 of the method M1, and reference may be made to the foregoing paragraphs for the related detailed descriptions and such descriptions are not provided again herein. For example, material and manufacturing method of a semiconductor substrate 551, well regions 503A and 503B, a deep well region 504, gate structures 530A and 530B, doped features 507A and 507B, spacers 520A and 520B, source/drain features 508A and 508B, metal silicide layers 509A and 509B, a CESL 540, a first ILD layer 542, source/drain contacts 550A and 550B, an etch stop layer 560, and a second ILD layer 562 may be substantially the same as or comparable to that of the semiconductor substrate 151, the well regions 103A and 103B, the deep well region 104, the gate structures 130A and 130B, the doped features 107A and 107B, the spacers 120A and 120B, the source/drain features 108A and 108B, the metal silicide layers 109A and 109B, the CESL 140, the first ILD layer 142, the source/drain contacts 150A and 150B, the etch stop layer 160, and the second ILD layer 162 as shown in FIGS. 2-12, and the related detailed descriptions may refer to the foregoing paragraphs, and are not described again herein.

Figure 25:
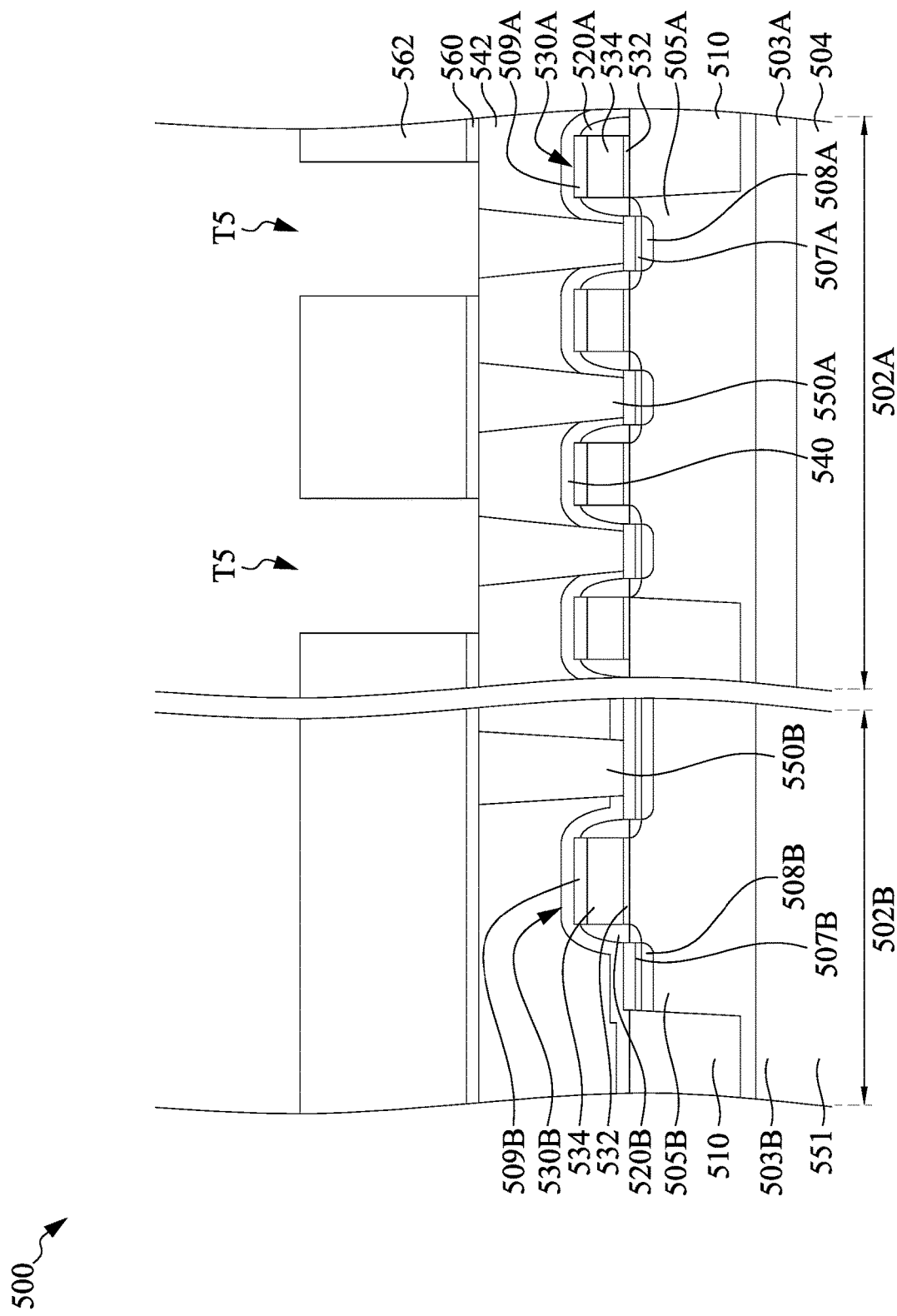
FIGS. 25 to 29 illustrate a method in various stages of forming an IC structure in accordance with some embodiments of the present disclosure.

In FIG. 25, the etch stop layer 560 and the second ILD layer 562 within the memory region 502A are etched to form a trench T5 that exposes the source/drain contact 550A. In greater detail, the trench T5 is formed by using a photolithography and an etching process. The etching process may include a dry etch, a wet etch, a reactive ion etch (RIE), or combination dry. Subsequently, the etch stop layer 560 in the trench T5 is removed to expose the source/drain contact 550A.

Figure 26:
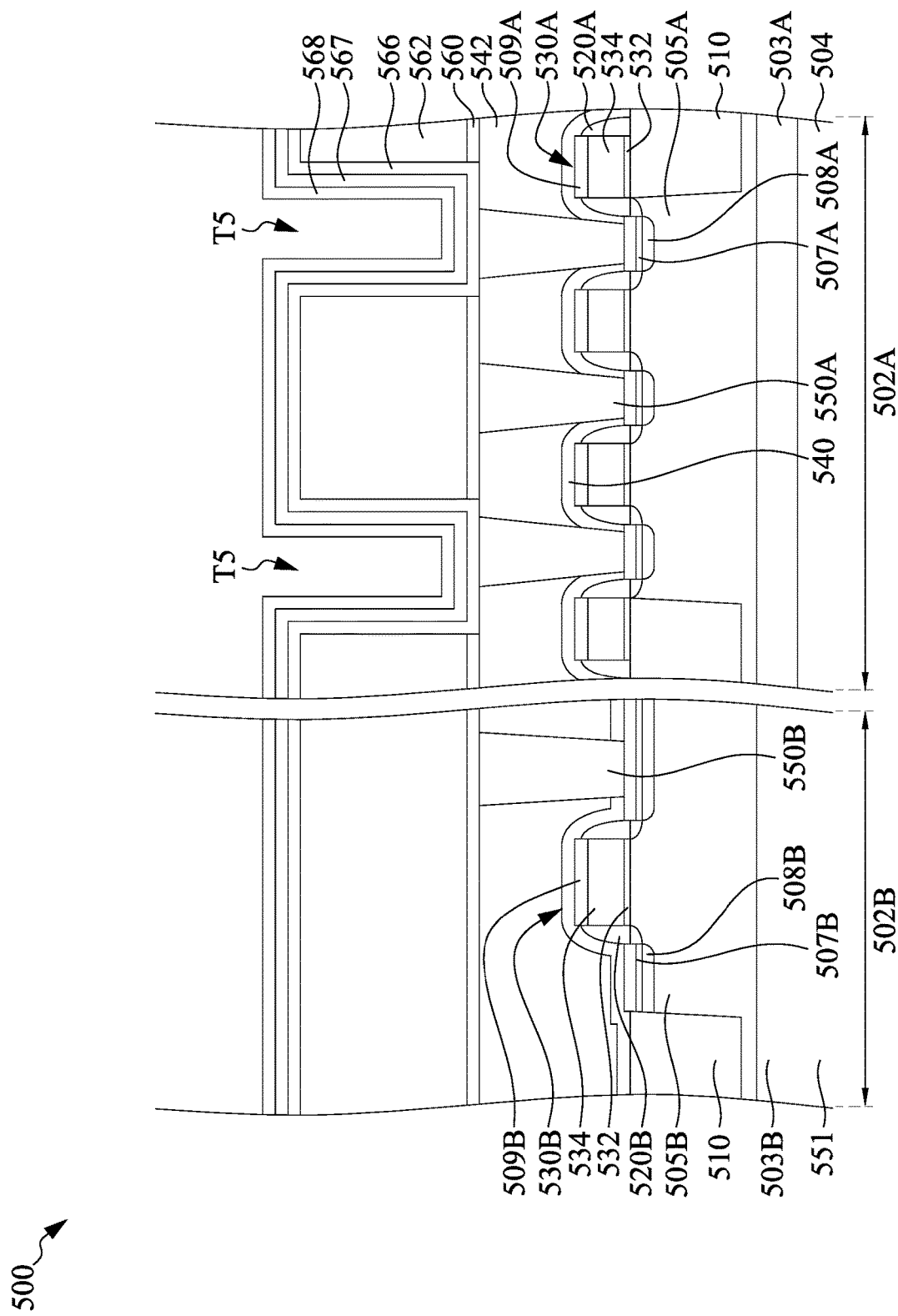

Returning to FIG. 24B, the method M2 then proceeds to block S212 where a bottom electrode layer, a ferroelectric layer, and a top electrode layer are conformally formed over the second ILD layer and in contact with the source/drain contact that exposes by the trench. With reference to FIG. 26, in some embodiments of block S212, a bottom electrode layer 566 is conformally formed over the second ILD layer 562 and in contact with the source/drain contact 550A that exposes by the trench T5. Specifically, the bottom electrode layer 566 lines a sidewall of the trench T5 and top surfaces of the source/drain contact 550A and the second ILD layer 562. In some embodiments, the bottom electrode layer 566 may include copper, Pt, Ru, aluminum, tantalum, tungsten, tantalum nitride (TaN), titanium, titanium nitride (TiN), combinations thereof, or other suitable materials. In some embodiments, the bottom electrode layer 566 may be formed by suitable processes such as plating, chemical vapor deposition (CVD), physical vapor deposition (PVD), atomic layer deposition (ALD), the like, and/or other suitable technique. In some embodiments, the bottom electrode layer 566 may include a stack of two or more layers, such as a titanium nitride/titanium or titanium nitride/tungsten.

Subsequently, a ferroelectric layer 567 is conformally formed over the bottom electrode layer 566. In some embodiments, the ferroelectric layer 567 may include ferroelectric materials, for example, HfO2, HfSiOx, HfZrOx, Al2O3, TiO2, LaOx, BaSrTiOx (BST), PbZrxTiyOz (PZT), doped hafnium oxide (Si:HfO$_2$), the like, or combinations thereof. In some embodiments, the ferroelectric layer 567 may be formed by chemical vapor deposition (CVD), such as high density plasma CVD (HDPCVD), plasma enhanced CVD (PECVD), atomic layer deposition (ALD), plasma enhanced ALD (PEALD), combinations thereof, and other suitable techniques.

It is appreciated that although some of the candidate materials (such as HfSiOx, HfZrOx, Al2O3, TiO2, and LaOx) of the ferroelectric layer 567 includes the same elements as some high-k dielectric materials, the ferroelectric layer 567 has different properties than high-k dielectric materials. For example, the ferroelectric layer 567 may have a resistivity lower than the respective high-k dielectric material that contains the same type of elements. The ferroelectric layer 567 may still be a dielectric layer, except that if it is used as a gate dielectric, the leakage current will be high. Accordingly, the ferroelectric layer 567 may not be suitable to be used as a gate dielectric even if it may also include the same elements as some known high-k dielectric materials. For example, the hafnium oxide ferroelectric layer 567 includes hafnium oxide doped with silicon or zirconium. In addition, the atomic percentages in the ferroelectric layer 567 may be different from the respective high-k dielectric materials that include the same elements. Alternatively stated, the composition (reflecting the type of elements and the percentages of the elements) of the ferroelectric layer 567 may be different from a high-k dielectric material even if they include the same elements. For example, HfSiOx, when used as a high-k material, has a relatively low atomic percentage ratio PHf/PSi, which may be smaller than about 10, wherein PHf is the atomic percentage of hafnium, and PSi is the atomic percentage of silicon. When used to form the ferroelectric layer 567, however, HfSiOx is Hf rich and Si poor. For example, the atomic percentage ratio PHf/PSi in the respective ferroelectric HfSiOx may be increased to greater than about 10, and may be in the range between about 10 and about 100.

Subsequently, the top electrode layer 568 is conformally formed over the ferroelectric layer 567. In some embodiments, the top electrode layer 568 may be formed by suitable processes such as plating, chemical vapor deposition (CVD), physical vapor deposition (PVD) and/or the like. In some embodiments, the top electrode layer 568 may include copper, Pt, Ru, aluminum, tantalum, tungsten, tantalum nitride (TaN), titanium, titanium nitride (TiN), combinations thereof, or other suitable materials. In some embodiments, the top electrode layer 568 has recesses R2 at its topmost surface due to nature of deposition.

Figure 27:
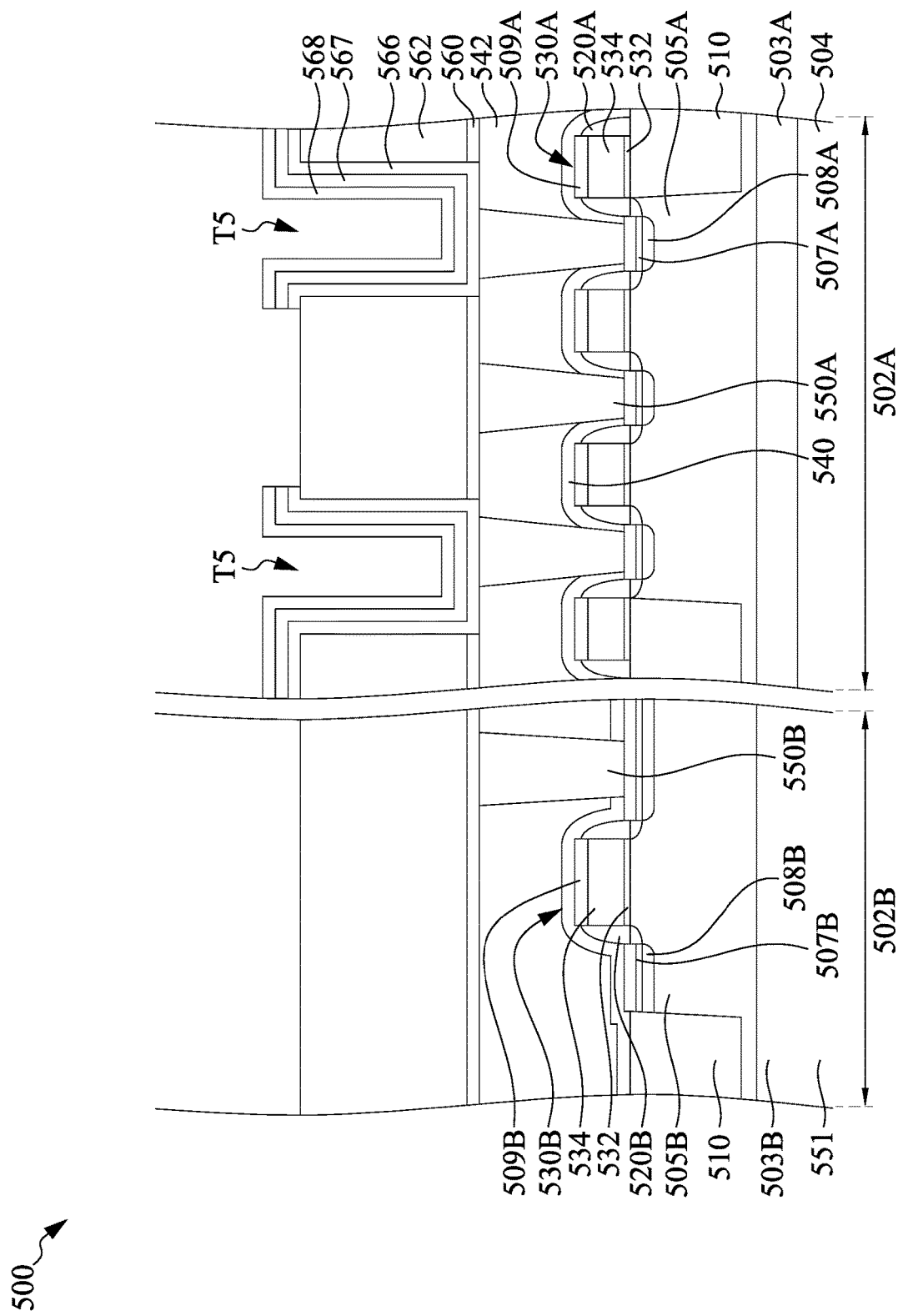

Returning to FIG. 24B, the method M2 then proceeds to block S213 where the top electrode layer, the ferroelectric layer, the bottom electrode layer are patterned. With reference to FIG. 27, in some embodiments of block S213, a sixth patterned mask is formed over the top electrode layer 568 and patterned to form separated mask portions. Specifically, the sixth patterned mask layer covers portions of the memory region 502A and exposes entirety of the logic region 502B. In some embodiments, the sixth patterned mask layer may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). Subsequently, portions of the top electrode layer 568, the ferroelectric layer 567, and the bottom electrode layer 566 are removed until the second ILD layer 562 is exposed through the sixth patterned mask. In greater detail, one or more etching processes are performed to remove portions of the top electrode layer 568, the ferroelectric layer 567, and the bottom electrode layer 566 of the memory region 502A and entirety of the top electrode layer 568, the ferroelectric layer 567, and the bottom electrode layer 566 of the logic region 502B.

Figure 28:
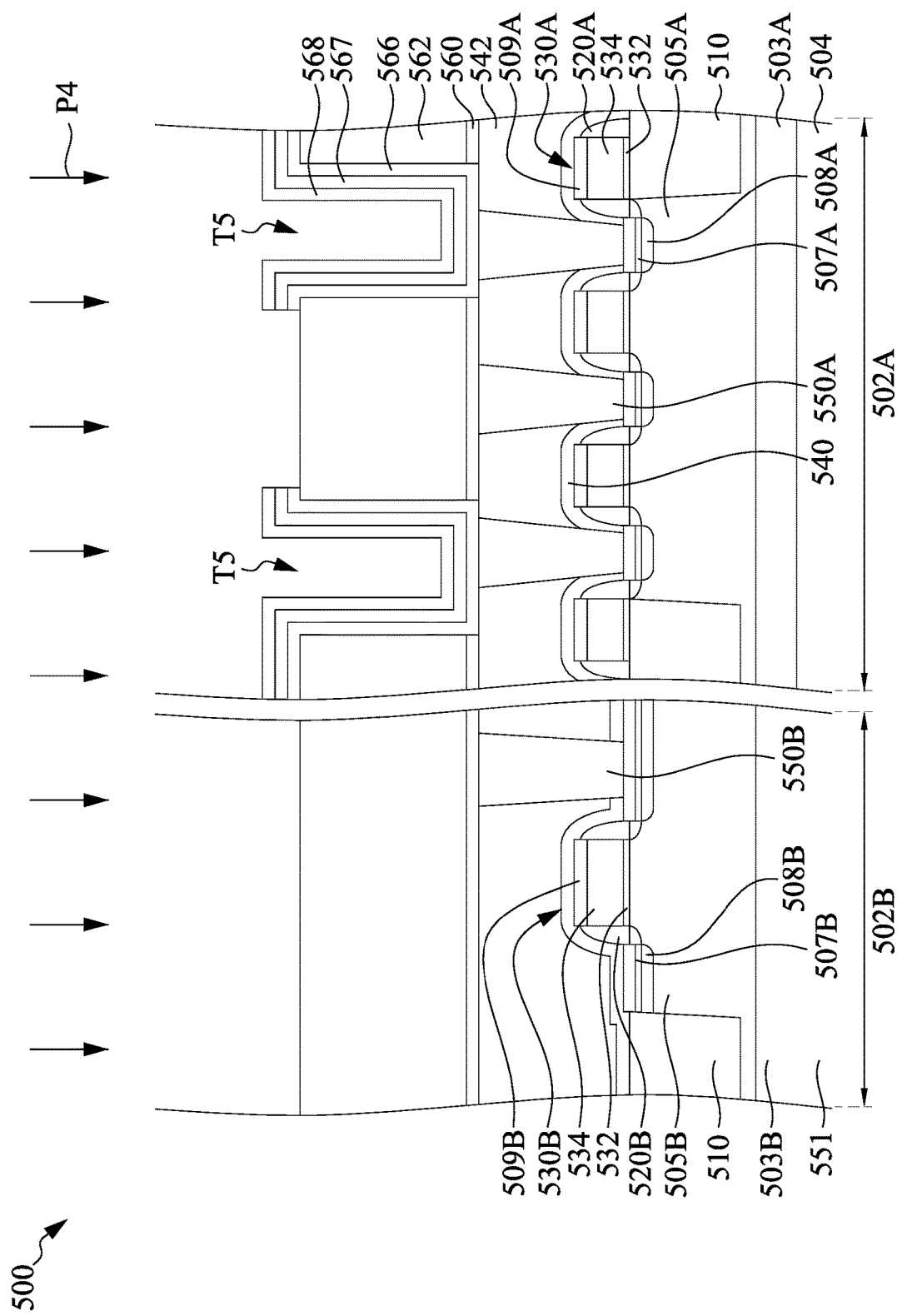

Returning to FIG. 24B, the method M2 then proceeds to block S214 where a heat treatment is performed on the ferroelectric layer to crystallize a ferroelectric material constituting the ferroelectric layer. With reference to FIG. 28, in some embodiments of block S214, a heat treatment P4 is performed on the ferroelectric layer 567 at a high temperature in an oxygen atmosphere to improve the quality of the ferroelectric layer 567, for example, to crystallize a ferroelectric material constituting the ferroelectric layer 567. In some embodiments, the heat treatment P4 may be annealing using a furnace or by Rapid Thermal Annealing (RTA). In some embodiments, the heating temperature is in a range from about 400° C. to about 1000° C.

Figure 29:
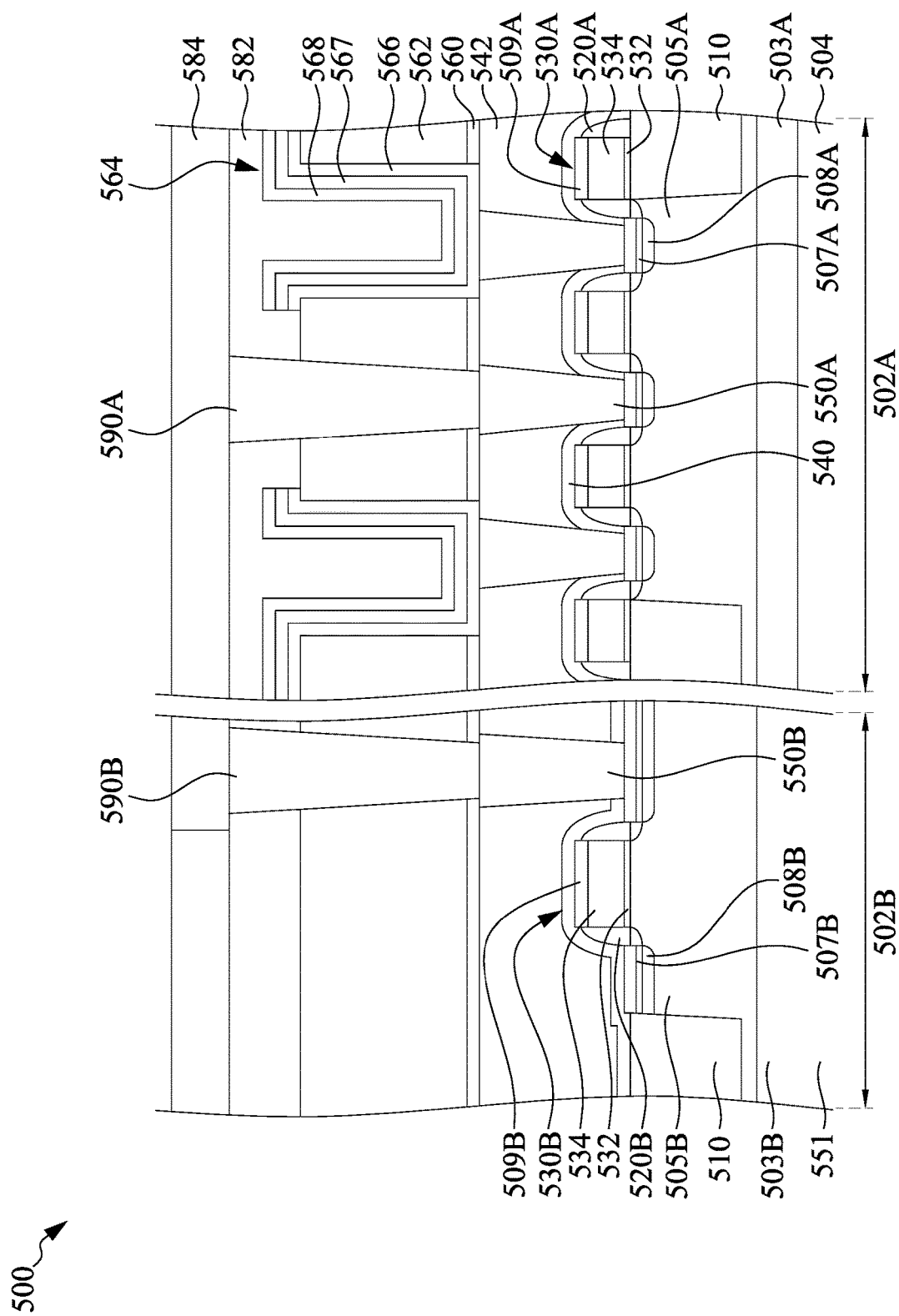

Returning to FIG. 24B, the method M2 then proceeds to block S215 where an interconnect structure is formed to electrically connect the transistors in the memory region and the logic region. With reference to FIG. 29, in some embodiments of block S215, a third ILD layer 582 is formed over the memory region 502A and the logic region 502B and fills in the remainder of the trench T5. In some embodiments, the third ILD layer 582 may be formed of a material different than the second ILD layer 562. In some embodiments, the third ILD layer 582 may be formed of a similar material as the second ILD layer 562. By way of example but not limiting the present disclosure, the third ILD layer 582 may be made of silicon oxide, silicon nitride, silicon oxynitride, tetraethoxysilane (TEOS), phosphosilicate glass (PSG), borophosphosilicate glass (BPSG), low-k dielectric material, other suitable material, or combinations thereof. Examples of low-k dielectric materials include, but are not limited to, fluorinated silica glass (FSG), carbon doped silicon oxide, amorphous fluorinated carbon, parylene, bis-benzocyclobutenes (BCB), or polyimide. In some embodiments, the dielectric materials used to form the third ILD layer 582 may be deposited using any suitable method, such as CVD, physical vapor deposition (PVD), ALD, PEALD, PECVD, SACVD, FCVD, spin-on, and/or the like, or a combination thereof.

Subsequently, an interconnect structure is formed to electrically connect the transistors in the memory region 502A and the logic region 502B. The interconnect structure includes vertical connections (vias/contacts) and horizontal connections (lines). This is described in greater detail with reference to FIG. 30, contacts 590A and 590B are formed to land on the source/drain features 550A and 550B within the memory region 502A and the logic region 502B simultaneously through the second and third ILD layers 562 and 582 and the etch stop layer 560. Subsequently, a plurality of metal layers (a metal layer 584 is illustrated) and inter-metal dielectric for insulating each of the metal layers are formed over the third ILD layer 182 for interconnecting the various devices in memory region 502A and the logic region 502B to form an integrated circuit or system-on-chip (SoC) device. In some embodiments, the contacts 590A and 590B and/or the metal layer 584 may be formed of copper (Cu), aluminum (Al), titanium (Ti), titanium nitride (TiN), tantalum (Ta), tantalum nitride (TaN), tantalum carbide (TaC), tantalum silicon nitride (TaSiN), tungsten (W), tungsten nitride (WN), molybdenum nitride (MoN), the like and/or combinations thereof.

In FIG. 29, an area of an interface between the bottom electrode layer 566 and the ferroelectric layer 567 is greater than an area of an interface between the bottom electrode layer 566 and the source/drain contact 550A and/or an area of an interface between the ferroelectric layer 567 and the top electrode layer 568 is greater than an area of an interface between the bottom electrode layer 566 and the source/drain contact 550A. As such, an effective area of the FeRAM structure 564 is greater than a projection area of the of the FeRAM structure 564 on the semiconductor substrate 551 which in turn allows for improving an effective area and/or enlarging the cell area of the FeRAM structure 564, thereby improving the memory window and reliability of the IC structure 500. In addition, the crown-type FeRAM structure can help to scale down the size of the memory cell. Furthermore, a heat treatment is performed on the ferroelectric layer 567 at a temperature higher than about 400° C. to improve the ferroelectric characteristic/response of the ferroelectric layer 567 in FeRAM structure 564. Because the FeRAM structure 464 is built on the source/drain contact 550A which is formed in the MEOL process other than BEOL process, a heat treatment may not in turn adversely affects interconnect structure which is formed in the BEOL process. In some embodiments, if the manufacturing temperature of the interconnect structure formed in the BEOL process is higher than about 400° C., some devices formed on the semiconductor substrate 551 may be destroyed.

Figure 30:
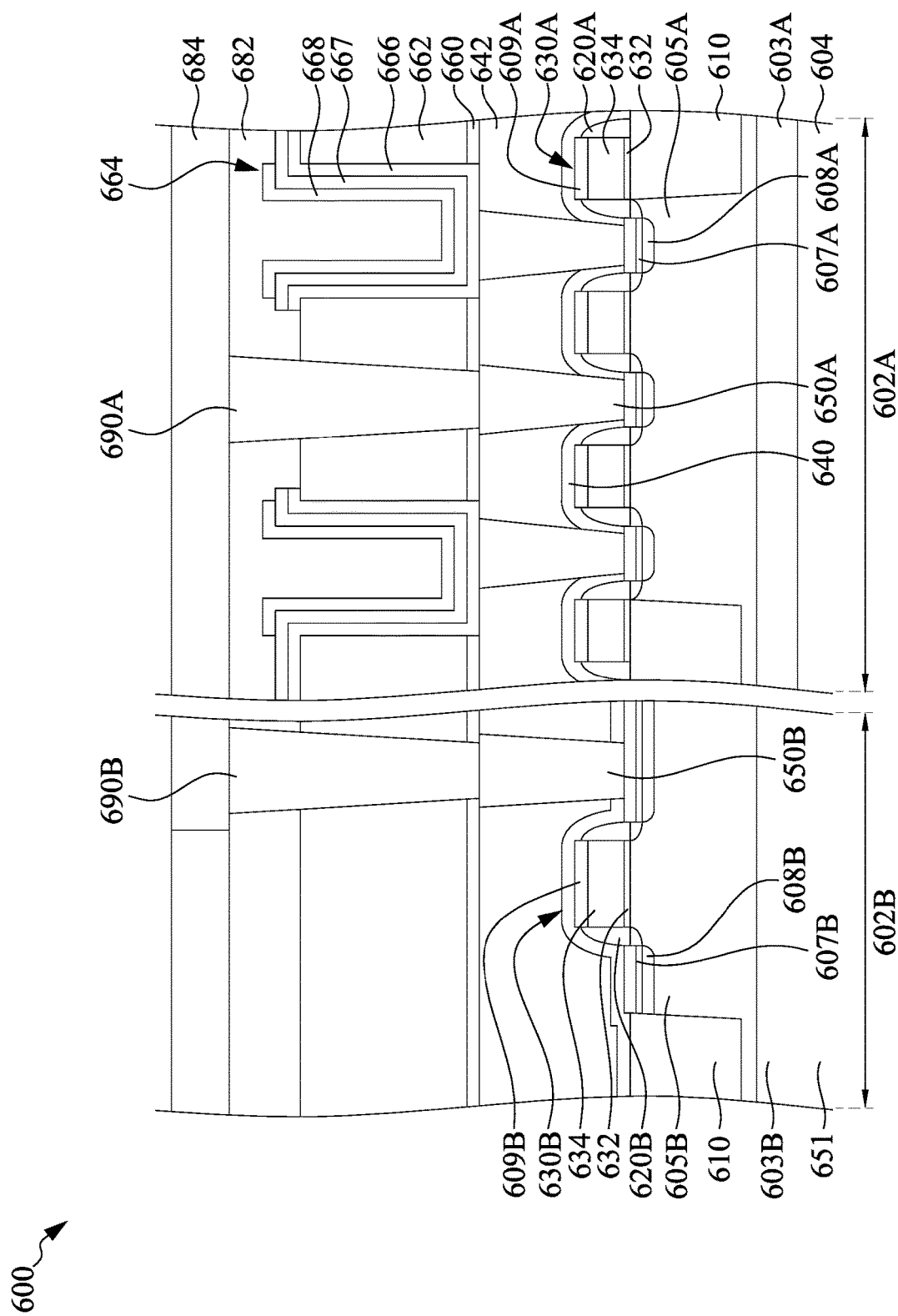
FIG. 30 illustrates an IC structure in accordance with some embodiments of the present disclosure.

FIG. 30 illustrates an IC structure 600 in accordance with some embodiments of the present disclosure. It is noted that some elements are not illustrated in FIG. 30 for brevity. The same or similar configurations and/or materials as described with FIGS. 25 to 29 may be employed in FIG. 30, and the detailed explanation may be omitted. In some embodiments, configurations and/or materials of a semiconductor substrate 651, well regions 603A and 603B, a deep well region 604, gate structures 630A and 630B, doped features 607A and 607B, spacers 620A and 620B, source/drain features 608A and 608B, metal silicide layers 609A and 609B, a CESL 640, a first ILD layer 642, source/drain contacts 650A and 650B, an etch stop layer 660, a second ILD layer 662, a bottom electrode layer 666, a ferroelectric layer 667, a top electrode layer 668, a third ILD layer 682, contacts 690A and 690B, and a metal layer 684 as shown in FIG. 30 may be substantially the same as or comparable to that of the semiconductor substrate 551, the well regions 503A and 503B, the deep well region 504, the gate structures 530A and 530B, the doped features 507A and 507B, the spacers 520A and 520B, the source/drain features 508A and 508B, the metal silicide layers 509A and 509B, the CESL 540, the first ILD layer 542, the source/drain contacts 550A and 550B, the etch stop layer 560, the second ILD layer 562, the bottom electrode layer 566, the ferroelectric layer 567, the top electrode layer 568, the third ILD layer 582, the contacts 590A and 590B, and the metal layer 584 as shown in FIGS. 25 to 29, and the related detailed descriptions may refer to the foregoing paragraphs, and are not described again herein.

The difference between the present embodiment and the embodiment in FIGS. 25 to 29 is that the top electrode layer 668 of the memory cell has an end surface set back from an end surface of the ferroelectric layer 667, such that by-product on the top electrode layer 668 and the ferroelectric layer 667 may be clean to prevent from a top/bottom electrode short. This is described in greater detail with reference to FIG. 30, a seventh patterned mask is formed over the top electrode layer 668 after patterning the top electrode layer 668 and the ferroelectric layer 667 as shown in FIGS. 24A to 29. The seventh patterned mask layer covers a middle portion of top electrode layer 668 and exposes opposite end portions of the top electrode layer 668. In some embodiments, the seventh patterned mask layer may be formed by a series of operations including deposition, photolithography patterning, and etching processes. The photolithography patterning processes may include photoresist coating (e.g., spin-on coating), soft baking, mask aligning, exposure, post-exposure baking, developing the photoresist, rinsing, drying (e.g., hard baking), and/or other applicable processes. The etching processes may include dry etching, wet etching, and/or other etching methods (e.g., reactive ion etching). Subsequently, the opposite end portions of the top electrode layer 668 are removed until the underlying ferroelectric layer 667 is exposed through the seventh patterned mask. In greater detail, one or more etching processes are performed to remove the opposite end portions of the top electrode layer 668 to set back the end surface of the top electrode layer 668 from the end surface of the ferroelectric layer 667. The seventh patterned mask subsequently stripped, such as by wet stripping or plasma ashing.

Based on the above discussions, it can be seen that the present disclosure offers advantages. It is understood, however, that other embodiments may offer additional advantages, and not all advantages are necessarily disclosed herein, and that no particular advantage is required for all embodiments. The bottom electrode layer of the FeRAM structure of the present disclosure has an U-shaped cross section and the ferroelectric layer and the top electrode layer are conformally formed on the bottom electrode layer. Hence, an area of an interface between the bottom electrode layer and the ferroelectric layer is greater than an area of an interface between the bottom electrode layer and the source/drain contact. Also, an interface between the ferroelectric layer and the top electrode layer is greater than an area of an interface between the bottom electrode layer and the source/drain contact. An advantage is that an effective area of the FeRAM structure is greater than a projection area of the of the FeRAM structure on the semiconductor substrate which in turn allows for improving an effective area and/or enlarging the cell area of the FeRAM structure, thereby improving the memory window and reliability of the IC structure. In addition, the crown-type FeRAM structure can help to scale down the size of the memory cell.

Furthermore, a heat treatment is performed on the ferroelectric layer at a temperature higher than about 400° C. to improve the ferroelectric characteristic/response of the ferroelectric layer in FeRAM structure. An advantage is that because the FeRAM structure is built on the source/drain contact which is formed in the MEOL process other than the BEOL process, a heat treatment may not in turn adversely affects interconnect structure which is formed in the BEOL process. In some embodiments, if the manufacturing temperature of the interconnect structure formed in the BEOL process is higher than about 400° C., some devices formed on the semiconductor substrate may be destroyed.

In some embodiments, a structure includes a semiconductor substrate, a gate structure, a source/drain feature, a source/drain contact, a dielectric layer, and a ferroelectric random access memory (FERAM) structure. The gate structure is on the semiconductor substrate. The source/drain feature is adjacent to the gate structure. The source/drain contact lands on the source/drain feature. The dielectric layer spans the source/drain contact. The FeRAM structure is partially embedded in the dielectric layer and includes a bottom electrode layer on the source/drain contact and having an U-shaped cross section, a ferroelectric layer conformally formed on the bottom electrode layer, and a top electrode layer over the ferroelectric layer. In some embodiments, the bottom electrode layer is in contact with the source/drain contact. In some embodiments, the bottom electrode layer has a topmost end in a position level with a top surface of the dielectric layer. In some embodiments, the bottom electrode layer has a greater height than a width thereof. In some embodiments, the ferroelectric layer extending along a top surface of the bottom electrode layer and a top surface of the dielectric layer. In some embodiments, the ferroelectric layer has an U-shaped cross section. In some embodiments, the ferroelectric layer laterally extends across a topmost end of the bottom electrode layer. In some embodiments, the top electrode layer laterally extends across a topmost end of the bottom electrode layer. In some embodiments, the top electrode layer has an end surface coterminous with an end surface of the ferroelectric layer. In some embodiments, the top electrode layer has an end surface set back from an end surface of the ferroelectric layer.

In some embodiments, a structure includes a semiconductor substrate, a contact, a first dielectric layer, a second dielectric layer, a bottom electrode layer, a ferroelectric layer, and a top electrode layer. The contact is over the semiconductor substrate. The first dielectric layer laterally surrounds the contact. The second dielectric layer is over the first dielectric layer and has a trench therein to expose the contact. The bottom electrode layer lines a sidewall of the trench and a top surface of the contact. The ferroelectric layer is conformally formed on the bottom electrode layer. The top electrode layer is over the ferroelectric layer. In some embodiments, the structure further includes a gate structure and a source/drain feature. The gate structure is on the semiconductor substrate. The source/drain feature is adjacent to the gate structure; in which the contact lands on the source/drain feature. In some embodiments, the bottom electrode layer has an U-shaped cross section. In some embodiments, the bottom electrode layer further forms on a top surface of the second dielectric layer. In some embodiments, the top electrode layer has an U-shaped cross section. In some embodiments, the second dielectric layer is made of a material substantially the same as the first dielectric layer. In some embodiments, the second dielectric layer is made of a material different than the first dielectric layer. In some embodiments, an area of an interface between the bottom electrode layer and the ferroelectric layer is greater than an area of an interface between the bottom electrode layer and the contact.

In some embodiments, a method includes: forming a gate structure on a substrate; forming a source/drain feature adjacent to the gate structure; forming a first dielectric layer over the gate structure and the source/drain feature; forming a source/drain contact extending through the first dielectric layer and landing on the source/drain feature; forming a second dielectric layer over the first dielectric layer; forming a bottom electrode layer through the second dielectric layer and in contact with the source/drain contact; forming a ferroelectric layer over the bottom electrode layer; forming a top electrode layer over the ferroelectric layer; performing an annealing process on the ferroelectric layer at a temperature higher than about 400° C. In some embodiments, the method further includes: forming a metal line over the top electrode layer at a temperature lower than about 400° C. In some embodiments, performing the annealing process is after forming the top electrode layer. In some embodiments, forming the bottom electrode layer comprises: etching the second dielectric layer to form a trench exposing the source/drain contact; after etching the second dielectric layer, conformally forming a bottom electrode layer over the second dielectric layer and in the trench; forming a sacrificial layer over the bottom electrode layer and in the trench; performing a planarization process on the sacrificial layer and the bottom electrode layer until the second dielectric layer is exposed; and after performing the planarization process, removing the sacrificial layer. In some embodiments, the second dielectric layer has a material substantially the same as the first dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
    forming a gate structure on a substrate;
    forming a source/drain feature adjacent to the gate structure;
    forming a first dielectric layer over the gate structure and the source/drain feature;
    forming a source/drain contact extending through the first dielectric layer and landing on the source/drain feature;
    forming a second dielectric layer over the first dielectric layer;
    forming a bottom electrode layer through the second dielectric layer and in contact with the source/drain contact;
    forming a ferroelectric layer over the bottom electrode layer;
    forming a top electrode layer over the ferroelectric layer; and
    performing an annealing process on the ferroelectric layer at a temperature higher than about 400° C.

2. The method of claim 1, wherein performing the annealing process is after forming the top electrode layer.

3. The method of claim 1, wherein forming the bottom electrode layer comprises:
    etching the second dielectric layer to form a trench that exposes the source/drain contact;
    conformally forming a bottom electrode layer over the second dielectric layer and in the trench;
    forming a sacrificial layer over the bottom electrode layer and in the trench;
    performing a planarization process on the sacrificial layer and the bottom electrode layer until the second dielectric layer is exposed; and
    after performing the planarization process, removing the sacrificial layer.

4. The method of claim 1, wherein the second dielectric layer has a material substantially the same as the first dielectric layer.

5. A method, comprising:
    forming a contact over a substrate;
    depositing a dielectric layer over the contact;
    forming a trench in the dielectric layer, the trench exposing the contact; and
    forming a ferroelectric random access memory (FERAM) structure in the dielectric layer and on the contact, forming the FeRAM structure comprising:
        conformally forming a bottom electrode layer over the dielectric layer and in the trench;
        forming a first sacrificial layer over the bottom electrode layer and in the trench;
        performing a planarization process on the first sacrificial layer and the bottom electrode layer until the dielectric layer is exposed;
        after performing the planarization process, removing the first sacrificial layer;
        conformally forming a ferroelectric layer on the bottom electrode layer; and
        conformally forming a top electrode layer on the ferroelectric layer.

6. The method of claim 5, further comprising:
    forming a gate structure on a substrate; and
    forming source/drain features on opposite sides of the gate structure, wherein the contact is on one of the source/drain features.

7. The method of claim 5, further comprising:
    performing an annealing process on the ferroelectric layer at a temperature higher than about 400° C.

8. The method of claim 5, wherein the first sacrificial layer is made of an antireflective coating material.

9. The method of claim 5, further comprising:
    forming a second sacrificial layer on the first sacrificial layer prior to performing the planarization process.

10. The method of claim 9, wherein the second sacrificial layer is a photo resist layer.

11. The method of claim 5, wherein the ferroelectric layer has a U-shaped cross section.

12. The method of claim 5, wherein the ferroelectric layer laterally extends across a topmost end of the bottom electrode layer and further on the dielectric layer.

13. The method of claim 5, wherein the top electrode layer has an end surface coterminous with an end surface of the ferroelectric layer.

14. The method of claim 5, wherein the top electrode layer has an end surface set back from an end surface of the ferroelectric layer.

15. A method, comprising:
    forming a gate pattern on an active region in a memory region;
    forming source/drain patterns on the active region and on opposite sides of the gate pattern;
    forming a source/drain contact on one of the source/drain patterns;
    forming a dielectric layer spanning the source/drain contact;
    forming a bottom electrode layer through the dielectric layer and in contact with the source/drain contact, the bottom electrode layer having an U-shaped cross section;
    conformally forming a ferroelectric layer on the bottom electrode layer; and
    conformally forming a top electrode layer on the ferroelectric layer.

16. The method of claim 15, further comprising:
performing an annealing process on the ferroelectric layer at a temperature higher than about 400° C.

17. The method of claim 15, wherein the bottom electrode layer has a topmost end in a position level with a top surface of the dielectric layer.

18. The method of claim 15, wherein the bottom electrode layer further forms on a top surface of the dielectric layer.

19. The method of claim 15, wherein an area of an interface between the bottom electrode layer and the ferroelectric layer is greater than an area of an interface between the bottom electrode layer and the contact.

20. The method of claim 15, wherein the top electrode layer has a U-shaped cross section.

* * * * *